United States Patent [19]

Yasuhara et al.

[11] Patent Number: 5,150,193
[45] Date of Patent: Sep. 22, 1992

[54] RESIN-ENCAPSULATED SEMICONDUCTOR DEVICE HAVING A PARTICULAR MOUNTING STRUCTURE

[75] Inventors: Toshihiro Yasuhara, Kokubunji; Masachika Masuda, Kodaira; Gen Murakami, Malhida; Kunihiko Nishi, Kokubunji; Masanori Sakimoto, Hinode; Ichio Shimizu, Tamamura; Akio Hoshi, Isesaki; Sumio Okada; Tooru Nagamine, both of Takasaki, all of Japan

[73] Assignees: Hitachi, Ltd., Tokyo; Hitachi Tobu Semiconductor, Ltd., Saitama, both of Japan

[21] Appl. No.: 653,244

[22] Filed: Feb. 11, 1991

Related U.S. Application Data

[63] Continuation of Ser. No. 198,316, May 25, 1988, abandoned.

[30] Foreign Application Priority Data

May 27, 1987 [JP] Japan ................. 52-128333
Sep. 19, 1987 [JP] Japan ................. 52-235903
Sep. 19, 1987 [JP] Japan ................. 52-235904
Sep. 19, 1987 [JP] Japan ................. 52-235905

[51] Int. Cl.⁵ ............... H01L 23/12; H01L 23/28
[52] U.S. Cl. ............................ 357/70; 357/72
[58] Field of Search ...................... 357/70, 72, 74

[56] References Cited

U.S. PATENT DOCUMENTS

| | | | |
|---|---|---|---|
| 4,048,438 | 9/1977 | Zimmerman | 357/70 |
| 4,698,660 | 10/1987 | Kubota et al. | 357/74 |
| 4,797,726 | 1/1989 | Manabe | 357/70 |
| 4,857,989 | 8/1989 | Mori et al. | 357/72 |
| 4,884,124 | 11/1989 | Mori et al. | 357/70 |
| 4,942,452 | 7/1990 | Kitano et al. | 357/70 |
| 4,942,454 | 7/1990 | Mori et al. | 357/70 |
| 4,952,999 | 8/1990 | Robinson et al. | 357/70 |
| 4,965,653 | 10/1990 | Otsuka et al. | 357/72 |
| 5,021,864 | 6/1991 | Keeley et al. | 357/70 |
| 5,021,865 | 6/1991 | Takahashi et al. | 357/70 |

Primary Examiner—Rolf Hille
Assistant Examiner—S. V. Clark
Attorney, Agent, or Firm—Antonelli, Terry, Stout & Kraus

[57] ABSTRACT

The present invention consists in that a through hole of large area is provided in a die pad or a tab, thereby to prevent a resin from cracking at the rear surface of a surface-packaging resin package in a high-temperature soldering atmosphere of vapor-phase reflow or the like, whereby a resin-molded surface-packaged IC of high reliability is provided.

28 Claims, 13 Drawing Sheets

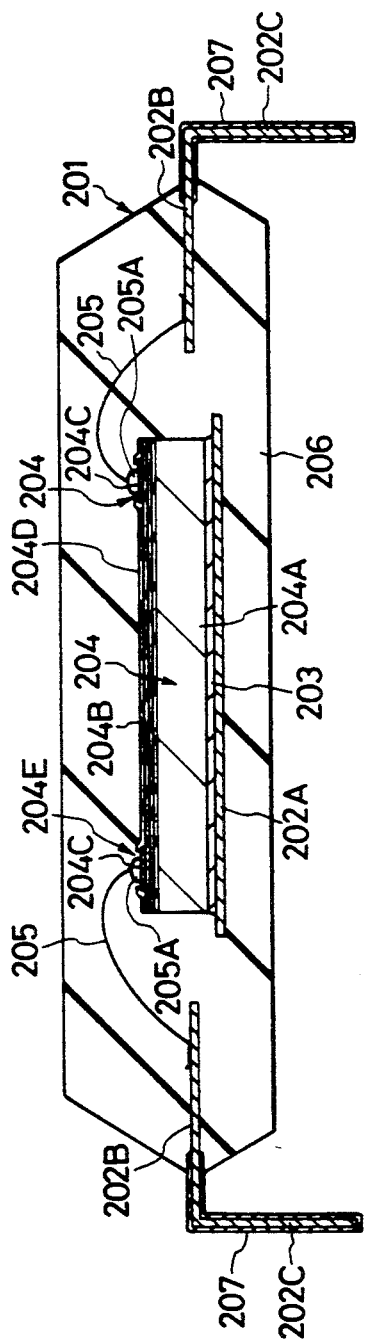
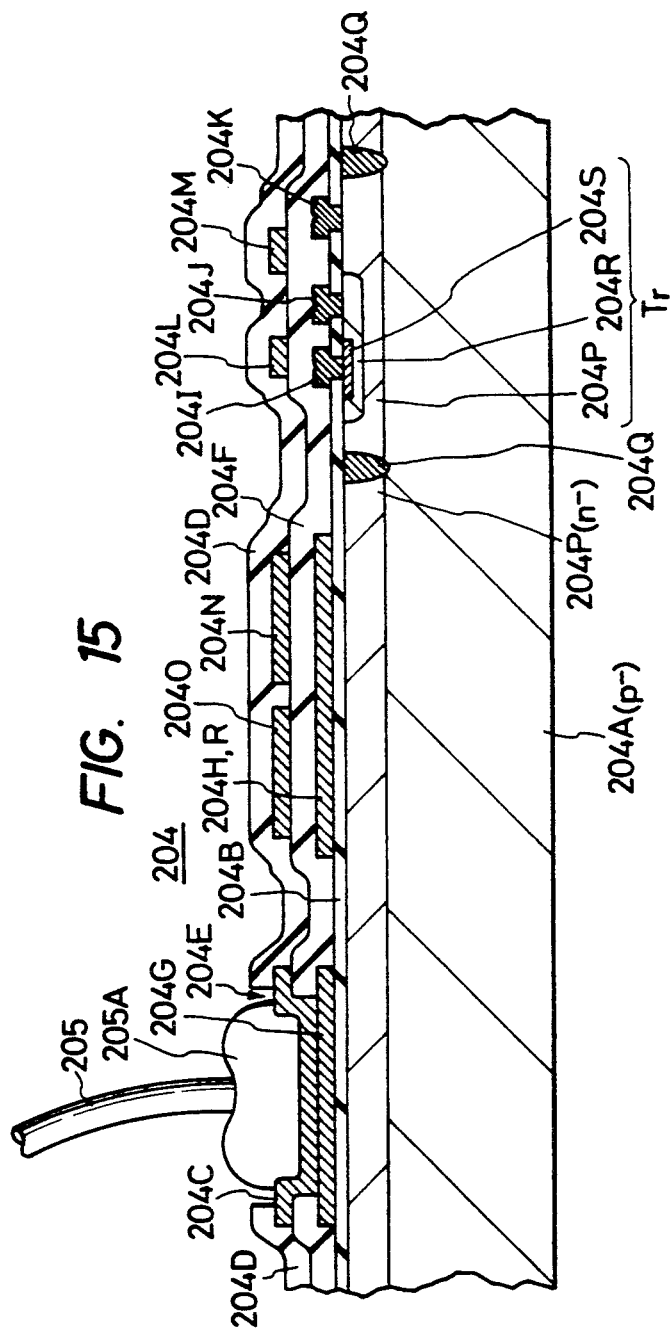

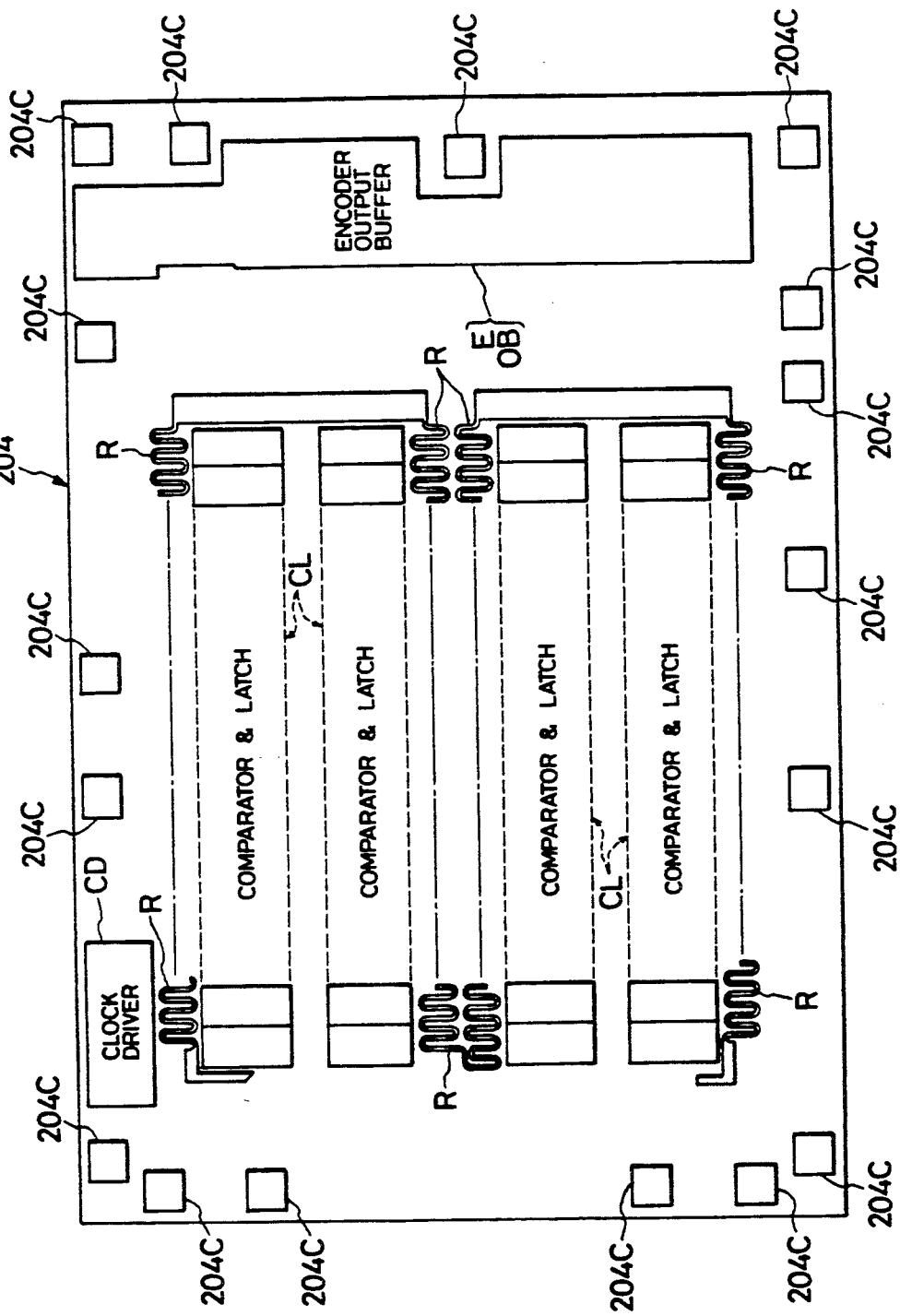

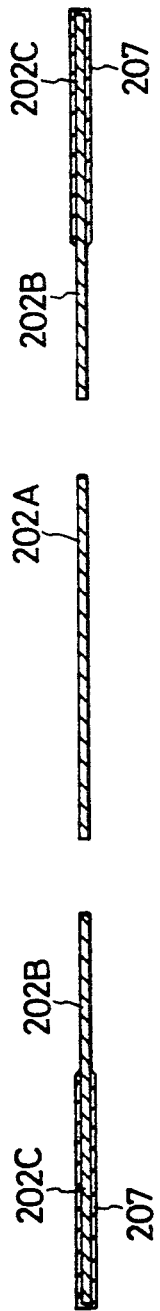
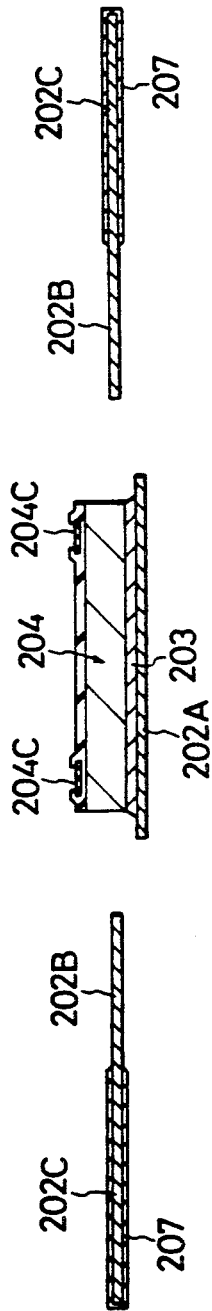
FIG. 18
FIG. 19

RESIN-ENCAPSULATED SEMICONDUCTOR DEVICE HAVING A PARTICULAR MOUNTING STRUCTURE

This is a continuation of application Ser. No. 198,316, filed May 25, 1988, now abandoned.

BACKGROUND OF THE INVENTION

The present invention relates to a semiconductor device, and more particularly to techniques which are effective when applied to a resin-encapsulated semiconductor device.

Further, the present invention relates to techniques for preventing the appearance of cracks in an electron device, especially a resin-molding package. The techniques are effective for, for example, a semiconductor integrated circuit device (hereinbelow, termed "IC") which is furnished with a surface-packaging plastic package.

As regards a semiconductor chip having a built-in DRAM (Dynamic Random Access Memory), it is the mainstream to mold the chip in the form of a resin-encapsulated semiconductor device of the SO (Small Out-line) type. The resin-encapsulated semiconductor device of this sort belongs to the so-called flat packaging type. The resin-encapsulated semiconductor device is such that a tab portion, the semiconductor chip mounted on the tab portion, and inner leads are molded in a resin. Each of outer leads is in the shape of a J-bend which protrudes out of a resin mold member and which extends to the lower surface of this resin mold member. The external terminals (bonding pads) of the semiconductor chip are connected to the inner leads through pieces of bonding wire. The resin mold member is formed of an epoxy type resin.

The resin-encapsulated semiconductor device thus constructed is installed on a printed-wiring circuit board by a vapor-phase reflowing process. In the vapor-phase reflowing process, a solder is deposited on both the printed-wiring circuit board and the outer leads of the resin-encapsulated semiconductor device in advance. Subsequently, a heat treatment is carried out in an atmosphere of dichlorodifluoromethane at about 230 [° C.] for about 90 [sec], whereby the solder is melted to connect the outer leads of the resin-encapsulated semiconductor device to the printed-wiring circuit board.

In addition, the tab portion is held connected to the frame portions of a lead frame through tab suspension leads before the step of cutting and molding the lead frame. Each of the tab suspension leads has one end side connected to the center of the shorter latus of the oblong tab portion, and has the other end side connected to the position of the frame portion of the lead frame discrepant from the central part thereof. That is, the central part of the tab suspension lead is in a shape similar to the shape of a crank so that the other end side of the tab suspension lead can be connected to the position discrepant from the central part of the frame portion. In a case where, at the step of pouring a resin, an inflow port (resin gate) for the resin is arranged centrally of the shorter latus of the tab portion, the other end side of the tab suspension lead is located so as not to agree with the position of the resin gate. In a case where the positions of the two are in agreement, the cracks of the resin mold member ascribable to a cutting tool appear frequently when the resin at a part corresponding to the inflow port is cut at the step of cutting and molding the lead frame. The inflow port for the resin is arranged at the central part of the shorter latus of the tab portion so as to bring the extending direction of the pieces of bonding wire and the inflowing direction of the resin into agreement lest the bonding wire pieces should be short-circuited by the inflow of the resin.

This resin-encapsulated semiconductor device of the SO type is described in, for example, "VLSI DEVICE HANDBOOK" issued by Kabushiki-Kaisha Science Forum on Nov. 28, 1983, pp. 221–231.

In addition, a certain IC for realizing a high density of packaging is furnished with a resin-molding package which is so constructed that the plane area of a tab with a pellet bonded thereto is comparatively large (for example, 5 mm-square or above), so outer leads are surface-packaged.

By the way, an example of literature containing such an IC is "IC IMPLEMENTATION PACKAGING TECHNOLOGY" issued by Kabushiki-Kaisha Kogyo Chosa-Kai on Jan. 10, 1980, pp. 135–155.

SUMMARY OF THE INVENTION

The inventor found out the occurrence of the following problems in the course of the development of a resin-encapsulated semiconductor device of the SO type in which a DRAM (semiconductor chip) having a large capacity of 4 [Mbits] is molded:

With the large capacity of 4 [Mbits], the semiconductor chip of the DRAM becomes large in size. The semiconductor chip of the DRAM which the inventor is developing, is in the shape of a rectangle having a size of 15.22 [mm]×5.91 [mm]. The semiconductor chip of this DRAM is molded into the SO-type resin-encapsulated semiconductor device of 350 [mils] (dimension of the shorter latus side thereof: approximately 8.89 [mm]). When this resin-encapsulated semiconductor device was installed on a printed-wiring circuit board by the vapor-phase reflowing process stated before, it was often the case that moisture adhering to a lead frame, particularly the rear surface of a tab portion and moisture within a resin mold member changed into water vapor, and that a resin was peeled off the rear surface of the tab portion of large occupation area by the pressure of the water vapor. The peeling of the resin off the rear surface of the tab portion incurs cracks in the resin mold member substantially simultaneously (so-called resin cracking). The cracks of the resin mold member appear more at the central part of the longer latus side thereof where the maximum stress is thought to arise, than on the shorter latus side thereof. For the above reason, the moisture-resistance of the resin-encapsulated semiconductor device deteriorates, and the available percentage of the articles of this device at the step of assemblage lowers.

Besides, the resin-encapsulated semiconductor device uses a binder for mounting the semiconductor chip on the front surface of the tab portion. Since the resin-encapsulated semiconductor device being developed by the inventor has the lead frame made of a copper (Cu)-based alloy or an iron-nickel alloy, the binder used is a silicone rubber type binder of low stress. When this binder has flowed out from the front surface of the tab portion to the side surface or rear surface thereof, the adhesion between the tab portion and the resin mold member degrades. For this reason, the resin conspicuously peels off the rear surface of the tab portion, and many cracks appear in the resin mold member as in the foregoing.

Further, the semiconductor chip has a plurality of external terminals arranged along each of the opposing shorter latera thereof. The external terminals are individually connected through pieces of bonding wire to a plurality of inner leads which are arrayed along the shorter latera of the tab portion (the shorter latera of the semiconductor chip). The individual inner leads are formed to be unitary with a plurality of outer leads which are arrayed along the longer latera of the tab portion, and they are extended round from the unitary joint parts to the shorter latus sides of the tab portion. The resin-encapsulated semiconductor device thus constructed requires an occupation area for extending the above inner leads round. It was therefore impossible to mold the large-sized DRAM semiconductor chip into the SO-type resin-encapsulated semiconductor device in the rectangular shape of 350 [mils] (dimension of the shorter latus side: approximately 8.89 [mm]).

Further, in the case of packaging such a large-sized DRAM semiconductor chip, the lengthwise dimension of each of tab suspension leads connected to the tab portion cannot be hold sufficient. More specifically, since the central part of the tab suspension lead cannot be formed in a shape similar to the shape of a crank, the tab suspension lead has one end side connected to the central part of the tab portion and has the other end side connected to the central part of the frame portion of the lead frame. Therefore, the position of the other end side of the tab suspension lead agrees with the position of an inflow port for the resin, so that many cracks appear in the resin mold member stated before.

Moreover, since one end side of the tab suspension lead is connected to the central part of the shorter latus of the tab portion, the tab portion is liable to rotate due to the inflow of the resin. Therefore, the bonding wire pieces and the semiconductor chip short-circuit, and the connected parts of the bonding wire pieces sever.

The inventor has also revealed the following problem: In an IC furnished with the surface-packaging plastic package as referred to above, the coefficients of thermal expansion are greatly different as to silicon which forms a pellet, "42 Alloy" or copper which forms a lead frame, and a resin which forms the package. Therefore, when the IC is heated in a temperature cycle test, a thermal shock test, etc. and also by dipping in a solder, a reflow soldering step, etc. in the packaging operation thereof, peeling arises at the bonded boundaries between the package and the pellet and between the package and the tab of the lead frame. As a result, cracks starting from the rear surface of the tab appear in the resin package.

An object of the present invention is to provide a technique capable of reducing the peeling of a resin mold member (a resin) from the rear surface of the tab portion of a resin-encapsulated semiconductor device.

Another object of the present invention is to provide, in a resin-encapsulated semiconductor device, a technique capable of reducing the peeling of a resin mold member from the rear surface of a tab portion as attributed to the pressure of water vapor.

Another object of the present invention is to provide, in a resin-encapsulated semiconductor device, a technique capable of reducing the peeling of a resin mold member from the rear surface of a tab portion as attributed to a binder for bonding the front surface of the tab portion and a semiconductor chip.

Another object of the present invention is to provide, in a resin-encapsulated semiconductor device, a technique capable of reducing the peeling of a resin mold member or the growth of cracks from the rear surface of a tab portion at the central parts of the longer latera of the oblong tab portion.

Another object of the present invention is to provide a technique capable of preventing the appearance of cracks in the resin mold member of a resin-encapsulated semiconductor device.

Another object of the present invention is to provide a technique capable of enhancing the moisture-resistance of a resin-encapsulated semiconductor device.

Another object of the present invention is to provide, in a resin-encapsulated semiconductor device, a technique capable of molding a large-sized semiconductor chip.

Another object of the present invention is to provide, in a resin-encapsulated semiconductor device, a technique capable of preventing the short-circuiting between pieces of bonding wire, etc. at a resin pouring step and also preventing the rotation of a tab portion attributed to the inflow of a resin.

Another object of the present invention is to provide an electron device which can prevent the appearance of cracks in a resin-molding package.

The aforementioned and other objects and novel features of the present invention will become apparent from the description of the specification and the accompanying drawings.

Typical aspects of performance of the present invention will be briefly summarized below:

The tab portion of a resin-encapsulated semiconductor device is centrally formed with an opening owing to which a resin is not severed, so that the peeling of the resin from the rear surface of a tab portion is suppressed.

Besides, in the resin-encapsulated semiconductor device, the above construction further includes slots which are formed in the front surface of the tab portion formed with the opening and which prevent a binder from flowing out of the front surface of the tab portion.

Besides, the longer latera of the oblong tab portion of the resin-encapsulated semiconductor device are centrally formed with tab suspension leads owing to which the resin is not severed, so that the peeling of the resin from the rear surface of the tab portion is suppressed.

According to the above-stated expedients, during a vapor-phase reflowing step, the resin can be relieved from being peeled off the rear surface of the tab portion by the pressure of water vapor which is produced by moisture adhering to the boundary between the rear surface of the tab portion and the resin, so that the cracks of a resin mold member can be prevented from appearing.

In addition to the above effect, the adhesive property between the resin and the side surface or rear surface of the tab portion can be enhanced, so that the peeling of the resin from the rear surface of the tab portion can be relieved to prevent the appearance of the cracks more.

Likewise to the above effects, the peeling of the resin from the rear surface of the tab portion is relieved, so that the appearance of the cracks of the resin mold member can be prevented, and even when the resin mold member has cracked, the cracks can be prevented from reaching the outer surface of the resin mold member.

In a further aspect of performance of the present invention, in a resin-encapsulated semiconductor device, a plurality of inner leads and outer leads are arrayed along each of the opposing longer latera of an oblong tab portion.

According to the above-stated expedient, the plurality of inner leads need not be extended round at the ends of the longer latus of the tab portion or a semiconductor chip, so that the lengthwise dimension of the tab portion comes to have room, and a large-sized semiconductor chip can be installed on the tab portion.

In a still further aspect of performance of the present invention, in a resin-encapsulated semiconductor device, a resin is poured from the central part of one of the opposing shorter latera of an oblong tab portion, and a first tab suspension lead is formed at a position which is discrepant from the center of the shorter latus, while a second tab suspension lead is formed at a position which is discrepant from the center of the other shorter latus and which is symmetric to the first tab suspension lead with respect to the origin being the intersection point of the diagonal lines of the tab portion.

According to the above-stated expedient, the first and second tab suspension leads are respectively arranged at the positions adapted to restrain the rotation of the tab portion, so that the tab portion can be prevented from rotating during the inflow of the resin.

In a yet further aspect of performance of the present invention, a tab which is a mounting portion for a pellet to be resin-molded in a package is formed with a through hole so as to penetrate the tab in the thickness direction thereof.

According to the above-stated expedient, even when a repetitive stress ascribable to a thermal stress subjects the boundary between the lower surface of the tab and the package or between the tab and the pellet to a force which urges them to peel off, the resin of the package filling up the through hole presents an anchoring effect enough to resist the peeling force, and hence, the peeling is reliably prevented. In the absence of the peeling, even when stresses concentrate near the outer edge of the rear surface of the tab within the package, cracks starting from the outer edge do not appear.

Moreover, since the cross-sectional area of the tab decreases owing to the formation of the through hole in the tab, the magnitude of elongation of the tab attributed to thermal expansion is reduced. As a result, the magnitude of a concentrated stress which is induced at the outer edge of the tab by the difference of the thermal expansions of the tab and the package resin is, in itself, suppressed to be small. Therefore, even if the peeling should arise, the appearance of cracks starting from the stress concentration place will be prevented within the package.

BRIEF DESCRIPTION OF THE DRAWINGS

FIG. 13 is a sectional view showing the schematic construction of a resin-encapsulated semiconductor device of the MPS type which is Embodiment VII of the present invention;

FIG. 14 is a layout plan of the semiconductor chip of the resin-encapsulated semiconductor device;

FIG. 15 is a sectional view of the essential portions of the semiconductor chip;

FIGS. 18 thru 23 are sectional views showing the various manufacturing steps of the resin-encapsulated semiconductor device and taken in correspondence with line II—II in FIG. 17A.

DETAILED DESCRIPTION OF THE INVENTION

Now, the construction of the present invention will be described in conjunction with embodiments in which the present invention is applied to a resin-encapsulated semiconductor device of the SO type for molding a DRAM having a large capacity of 4 [Mbits].

Throughout the drawings for elucidating the embodiments, the same symbols are assigned to portions having identical functions, and they shall not be repeatedly explained.

Embodiment I

Figure 1:
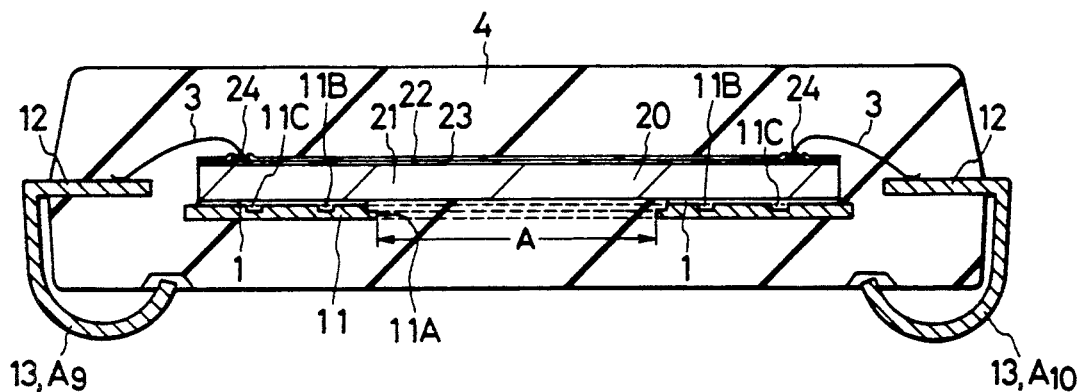
FIG. 1 is a sectional view of the essential portions of a resin-encapsulated semiconductor device of the SO type which is Embodiment I of the present invention.
Figure 2:
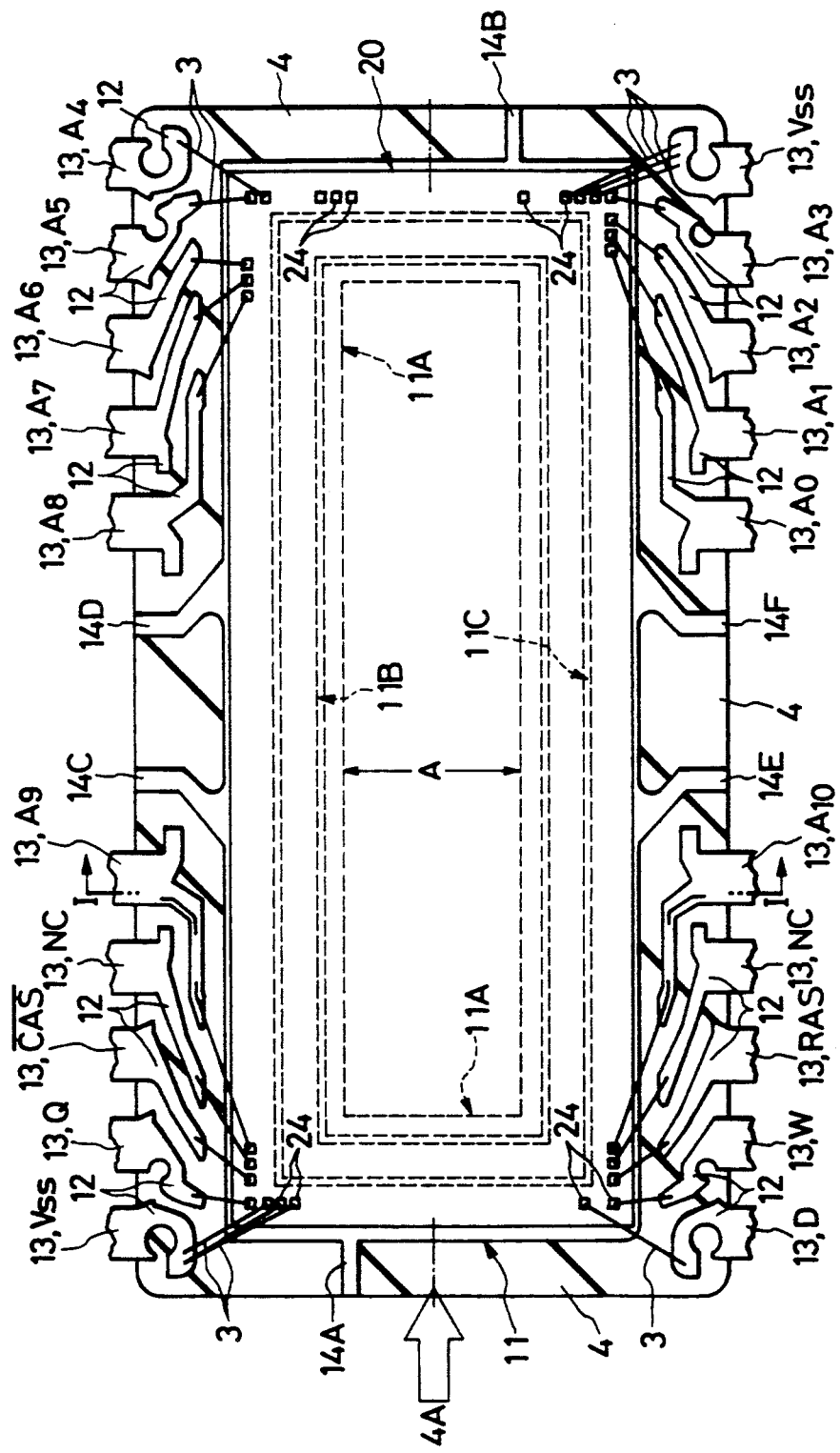
FIG. 2 is a partially-sectional plan view of the resin-encapsulated semiconductor device shown in FIG. 1.

A resin-encapsulated semiconductor device of the SO (SOJ) type which is Embodiment I of the present invention is shown in FIG. 2 (a partially-sectional plan view) and FIG. 1 (a sectional view taken along line I—I in FIG. 2).

As shown in FIGS. 1 and 2, the resin-encapsulated semiconductor device has a semiconductor chip 20 mounted on the front surface of a tab portion 11 through a binder 1.

The semiconductor chip 20 has a built-in DRAM having a large capacity of 4 [Mbits]. This semiconductor chip 20 is in the shape of a rectangle of, for example, 15.22 [mm]×5.91 [mm]. As shown in FIG. 1, the semiconductor chip 20 includes a p-type or n-type semiconductor substrate 21 made of single-crystal silicon, the principal surface of which has memory cells (not shown) arrayed therein. The memory cell of 1 [bit] is constructed of a series circuit which consists of a MISFET for selecting the cell and a capacitor element for storing information. Although not shown, either, memory cell arrays in each of which the plurality of memory cells are arranged are constructed at the central part of the semiconductor chip 20, and the peripheral circuits of the DRAM are arranged on the respective shorter latus sides of the semiconductor chip 20. In the outermost peripheral area of the DRAM and on elements constituting the memory cells as well as the peripheral circuits, external terminals (bonding pads) 24 are arrayed through an interlayer insulator film 22. The external terminals 24 are arranged along the shorter latera of the semiconductor chip 20 and the longer latera thereof at angular parts. The external terminals 24 are so constructed that their front surfaces are exposed from openings which are provided in a passivation film 23 formed as the uppermost layer of the semiconductor chip 20. The external terminals 24 are formed by the same manufacturing step as that of wiring, for example, aluminum wiring for connecting the elements of the DRAM.

The external terminals 24 of the semiconductor chip 20 are connected to inner leads 12 through pieces of bonding wire 3. As the bonding wire 3, gold (Au) wire or copper (Cu) wire coated with Au is used. The bonding wire 3 is not restricted thereto, but Cu wire or aluminum (Al) wire, for example, may well be used. The bonding wire piece 3 is connected to both the external terminal 24 and the inner lead 12 by wedge ball bonding. More specifically, although the connecting operation is not illustrated, one end side of the bonding wire piece 3 is formed with a ball by means of an arc electrode, and it is thereafter connected to the external terminal 24 by means of a capillary by employing ultrasonic vibrations conjointly with thermocompression. The other end side of the bonding wire piece 3 is connected to the inner lead 12 by means of the capillary by employing the ultrasonic vibrations conjointly with the thermocompression.

Since the tab portion 11 carries the rectangular semiconductor chip 20 thereon, it is in the shape of a rectangle of approximately 15.62 [mm]×6.1 [mm]. In order to reduce the level difference of the connected positions of each bonding wire piece 3, the tab portion 11 is situated to be somewhat lower than the inner leads 12. The tab portion 11 is made of Cu, and it has a thickness of, for example, about 0.2 [mm]. Alternatively, the tab portion 11 may well be made of an iron-nickel alloy.

Figure 3:
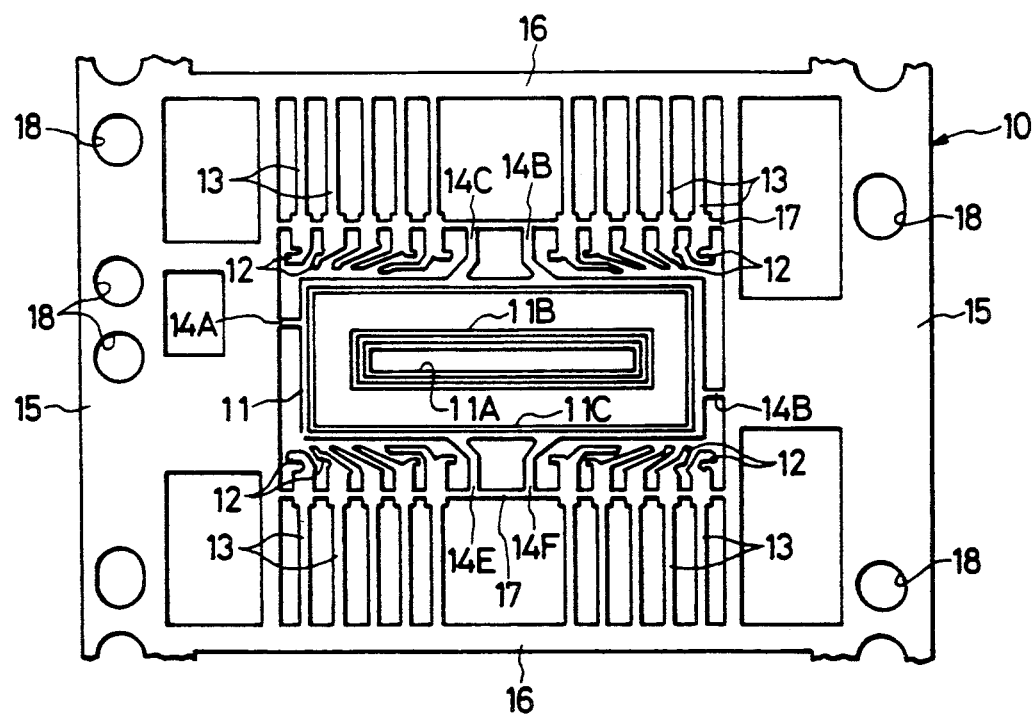
FIG. 3 is a plan view of a lead frame which is used in the resin-encapsulated semiconductor device.

As shown in FIG. 3 (a plan view of a lead frame), the tab portion 11 is constructed to be unitary with the inner leads 12, outer leads 13 and tab suspension leads 14A-14F in the state of the lead frame 10. That is, the inner leads 12, etc. are made of the same material as that of the tab portion 11.

As seen from FIG. 3, the lead frame 10 forms one unit thereof within an area enclosed with right and left outer frame portions 15 which extend in parallel with each other, and upper and lower inner frame portions 16 which extend in parallel with each other and which are continuous to the outer frame portions 15 while intersecting them orthogonally. That is, the lead frame 10 includes the tab portion 11, the inner leads 12, the outer leads 13 and the tab suspension leads 14A-14F within the area of one unit.

The tab portion 11 lies at the central part of the area. It has one shorter latus thereof connected to the left outer frame portion 15 through the tab suspension lead 14A, and has the other opposing shorter latus thereof connected to the right outer frame portion 15 through the tab suspension lead 14B. In addition, the tab portion 11 has one longer latus thereof on the upper side connected through the tab suspension leads 14C and 14D to an upper tie bar 17 which extends in parallel with the inner frame portion 16, and it has the other longer latus thereof on the lower side connected through the tab suspension leads 14E and 14F to a lower tie bar 17. That is, the tab suspension leads 14A-14F are provided in a total number of six. Each of the tie bars 17 is connected to the outer frame portions 15. The inner leads 12 and the outer leads 13 are constructed to be unitary, and a plurality of sets of unitary inner leads 12 and outer leads 13 are arrayed along each of the longer latera of the tab portion 11. Each of the outer leads 13 has one end side thereof connected to the inner frame portion 16, and has the other end side (on which it is unitary with the corresponding inner lead 12) connected to the tie bar 17. As illustrated in FIG. 1, the outer lead 13 is shaped into a J-bend after the semiconductor chip 20, etc. have been sealed with a resin mold member 4. Each of the outer frame portions 15 is formed with a plurality of holes 18 for transporting the lead frame 10 in the extending direction thereof or for positioning it.

The outer leads 13 (and also the inner leads 12) are respectively endowed with functions as illustrated in FIGS. 1 and 2. The outer lead 13, D is for a data input signal. The outer lead 13, W is for a read/write designation input signal. The outer lead 13, RAS is for a row address strobe input signal. The outer leads 13, NC are dead or non-connected terminals. The outer leads 13, $A_0$-$A_{10}$ are for address signals. The outer lead 13, CAS is for a column address strobe input signal. The outer lead 13, Q is for a data output signal. The outer lead 13, $V_{cc}$ is for a power source voltage, for example, the operating potential 5 [V] of the circuitry. The outer lead 13, $V_{ss}$ is for a reference potential, for example, the ground potential 0 [V] of the circuitry. Each of the inner leads 12 for the power source voltage and for the reference voltage is subjected to so-called double or triple bonding in which a plurality of bonding wire pieces 3 are connected.

A silicone rubber type binder of low stress is used as the binder 1 with which the front surface of the tab portion 11 is coated in order to bond the semiconductor chip 20 thereon.

The tab portion 11, the semiconductor chip 20, the bonding wire pieces 3, the inner leads 12, and parts of the tab suspension leads 14A-14F are sealed with the resin mold member 4. This resin mold member 4 is made of an epoxy type resin which is doped with a phenol type hardener, silicone rubber and a filler in order to attain a low stress. The silicone rubber functions to lower the coefficient of thermal expansion of the epoxy type resin. The filler is formed of spherical silicon-oxide grains, and it similarly functions to lower the coefficient of thermal expansion. This filler is added into the epoxy type resin in an amount of, for example, about 70-75 [weight-%].

As shown in FIGS. 1 and 2, the resin-encapsulated semiconductor device thus constructed is provided with an opening (a through hole) 11A in the central part of the tab portion 11. The opening 11A is formed in a shape which is substantially similar to the shape of the tab portion 11. Since the tab portion 11 is formed into the rectangle as stated before, the opening 11A is in the shape of a rectangle. The vertical sectional configuration of the opening 11A is a stepped shape in which the size of the opening is larger on the front surface side of the tab portion 11 than on the rear surface side thereof. Alternatively, the vertical sectional configuration of the opening 11A may well be a tapered shape in which the size of the opening is larger on the front surface side of the tab portion 11 than on the rear surface side thereof, or a substantially rectangular shape (in which the side walls of the opening 11A are substantially vertical).

Figure 4:
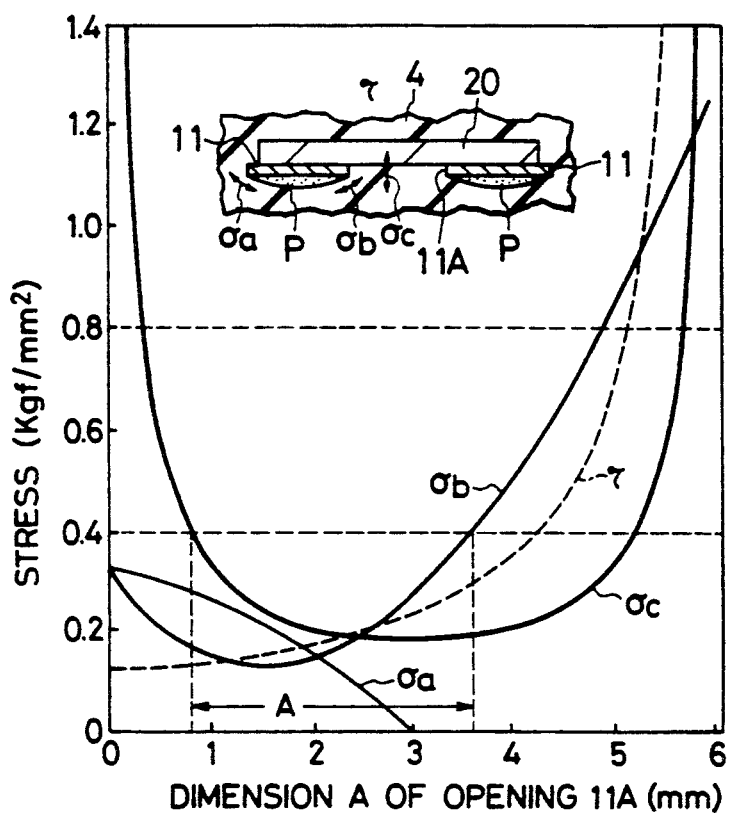
FIG. 4 is a diagram showing the relationship between the dimension of an opening formed in a tab portion and a stress arising in a resin mold member in the resin-encapsulated semiconductor device.

The dimensions of the opening 11A are set on the basis of FIG. 4 (a diagram showing the relationship between the dimension of the opening and a stress arising in the resin mold member). The axis of abscissas in FIG. 4 indicates the dimension A [mm] of the opening 11A (the dimension of the opening 11A in the direction of the shorter latera of the tab portion 11) at a part (the central part of the tab portion 11 along the longer latera thereof) where the stress ascribable to the pressure P of water vapor produced during a vapor-phase reflowing step becomes the maximum. The axis of ordinates indicates the stress [kg-f/mm$^2$] which acts on the resin mold member 4.

A stress $\sigma_a$ shown in FIG. 4 is an internal stress which is caused by the water vapor pressure P in the parts of the resin mold member 4 corresponding to the corner parts of the longer latera of the tab portion 11. A stress $\sigma_b$ is an internal stress which is caused in the parts of the resin mold member 4 corresponding to the corner parts of the opening 11A provided in the tab portion 11. A stress $\sigma_c$ is an internal stress which is caused in the part of the resin mold member 4 within the opening 11A. A stress $\tau$ is a shearing stress which is caused in the parts of the resin mold member 4 corresponding to the corner parts of the opening 11A. The respective stresses $\sigma_a$, $\sigma_b$, $\sigma_c$ and $\tau$ shown in FIG. 4 are values in the case where the water vapor pressure P is 10 atmospheres.

The inventor's basic researches have revealed that, when the stress shown in FIG. 4 reaches about 8 [kg-f/mm$^2$], the resin mold member 4, especially the resin within the opening 11A is severed. For an actual product, therefore, the stress is suppressed to be a half or 4 [kg-f/mm$^2$] or less in anticipation of safety. Under such a condition and on the basis of the stresses $\sigma_b$, $\sigma_c$ and $\tau$, the dimension A of the opening 11A needs to be set at 0.8–3.7 [mm] in order that the resin within the opening 11A may be prevented from severing and that the resin may be restrained from peeling off the rear surface of the tab portion 11 in the opening 11A, against the water vapor pressure P. The dimension A of the opening 11A accounts for 13–60 [%] relative to the dimension of the tab portion 11 in the shorter latus direction thereof. When the dimension A of the opening 11A in the part where the maximum stress appears has been set, the shape of the opening 11A is set on the basis of this dimension A so as to attain a uniform bonding area with the semiconductor chip 20. That is, the shape of the opening 11A is similar to that of the tab portion 11 as stated before. In the inventor's basic researches, the severance of the resin within the opening 11A often occurred in cases where the tab portion 11 was formed with a narrow opening 11A (an elongate slit) whose dimension A was 0.3–0.4 [mm] or less.

In this manner, in the resin-encapsulated semiconductor device, the tab portion 11 is centrally provided with the opening 11A which prevents the resin from being severed and which restrains the resin from being peeled off the rear surface of the tab portion 11, whereby even when the water vapor pressure P is generated by moisture adhering to the boundary between the rear surface of the tab portion 11 and the resin, during the vapor phase reflowing step (for example, in an atmosphere of dichlorodifluoromethane at 230 [°C.] for 90 [sec]), the resin can be relieved from peeling off the rear surface of the tab portion 11, and hence, the cracks of the resin mold member 4 can be prevented from appearing. As a result, the moisture resistance of the resin-encapsulated semiconductor device can be enhanced. Moreover, the available percentage of the resin-encapsulated semiconductor device can be enhanced at the assemblage step of sealing the semiconductor chip 20 with the resin mold member 4.

In addition, since the resin-encapsulated semiconductor device can enhance the moisture resistance as described above, dampproof packing and its operation can be abolished.

As shown in FIGS. 1 thru 3, the front surface of the tab portion 11 is provided with slots 11B and 11C. The slot 11B is formed in that part of the front surface of the tab portion 11 which circumscribes the opening 11A. The slot 11C is formed in the part which extends along and inside the outer periphery of the tab portion 11 on the outer side of the slot 11B. By way of example, each of the slots 11B and 11C has a depth nearly equal to a half (0.1 8 mm]) of the thickness of the tab portion 11 and a width nearly equal to 0.1–0.2 [mm]. It can accumulate part of the binder 1 applied on the front surface of the tab portion 11, so as to prevent the binder 1 from flowing out from the front surface of the tab portion 11 to the side surfaces or rear surface thereof.

In this manner, in the resin-encapsulated semiconductor device, the front surface of the tab portion 11 is formed with both the slots 11B and 11C which prevent the binder 1 from flowing out from the front surface of the tab portion 11, whereby the adhesion between the resin and the side surfaces and rear surface of the tab portion 11 can be enhanced, and hence, the peeling of the resin from the rear surface of the tab portion 11 can be reduced to prevent the appearance of the the cracks more. Besides, the appearance of the cracks mentioned above can be prevented more effectively by forming both the slots 11B and 11C in the front surface of the tab portion 11 and also forming the opening 11A in the central part of the tab portion 11. By the way, it is basically sufficient to form either of the slots 11B and 11C in the front surface of the tab portion 11.

An inflow port for a resin (a resin gate), diagrammatically denoted by symbol 4A in FIG. 2, which serves to form the resin mold member 4 shown in FIG. 2 at the step of pouring the resin, is arranged at the central part of one (or both) of the opposing shorter latera of the tab portion 11. The central part of the shorter latus, namely, the part corresponding to the central part of the shorter latus of the semiconductor chip 20, is an area where no external terminals 24 are arranged and where no bonding wire pieces 3 exist. The resin poured through the inflow port 4A branches from the central part of one shorter latus of the tab portion 11 to the front surface side and rear surface side of the tab portion 11, and flows along the longer latera of the tab portion 11. Since the resin of the resin mold member 4 has its viscosity heightened in order to lower the stress as stated before, the inflow port 4A is arranged at the central part of the shorter latus so that the bonding wire pieces 3 may not be short-circuited by the inflow of the resin and that the resin may be poured uniformly. In the resin-encapsulated semiconductor device thus constructed, the inflow port 4A and the tab suspension lead 14A for supporting one shorter latus of the tab portion 11 are staggeredly arranged lest the resin mold member 4 should be cracked by a cutting tool at the step of cutting and molding the lead frame 10. That is, the tab suspension lead 14A is arranged at a position discrepant from the center of one shorter latus of the tab portion 11 (the position where the inflow port 4A exists). The tab suspension lead 14A is formed in a substantially straight shape because there is no room between one shorter latus of the tab portion 11 and the outer frame 15 of the lead frame 10 on account of the enlarged size of the semiconductor chip 20.

The other shorter latus of the tab portion 11 is supported by the tab suspension lead 14B which has substantially the same shape as that of the tab suspension lead 14A. The tab suspension lead 14B is arranged at a position which is symmetric to the tab suspension lead 14A with respect to the origin (the intersection point of the two diagonal lines of the oblong tab portion 11). That is, since the tab suspension lead 14A is arranged at the position discrepant from the center of one shorter latus, the tab suspension lead 14B is located so as to prevent the tab portion 11 from rotating during the inflow of the resin.

Likewise, the tab suspension leads 14C-14F for supporting the tab portion 11 are also adapted to prevent the rotation of the tab portion 11.

In this manner, in the resin-encapsulated semiconductor device, the resin is poured from the center of one of the opposing shorter latera of the oblong tab portion 11, the tab suspension lead (the first) 14A is provided at the position discrepant from the center of the shorter latus, and the tab suspension lead (the second) 14B is provided at the position which is discrepant from the center of the other shorter latus and which is symmetric to the tab suspension lead 14A with respect to the origin, whereby the respective tab suspension leads 14A and 14B are arranged at the positions suppressing the rotation of the tab portion 11, and hence, the tab portion 11 can be prevented from rotating during the inflow of the resin.

Further, as stated before, the resin-encapsulated semiconductor device has the plurality of inner leads 12 and outer leads 13 arrayed along both the opposing longer latera of the oblong tab portion 11 (or semiconductor chip 20) as illustrated in FIGS. 2 and 3. In other words, the inner leads 12 and outer leads 13 are arranged within areas which are defined by the dimension of the longer latera of the tab portion 11.

With the resin-encapsulated semiconductor device thus constructed, it is dispensed with to extend a plurality of inner leads round from the longer latus sides to the shorter latus sides at the end parts of the longer latera of the tab portion 11. Therefore, the size of the tab portion 11 comes to have room, and the tab portion 11 can place thereon the large-sized semiconductor chip 20 in which the DRAM having the large capacity of 4 [Mbits] is built.

Embodiment II

Embodiment II is the second embodiment of the present invention in which the parts most liable to cracks in the resin mold member of a resin-encapsulated semiconductor device are further reinforced.

Figure 5:
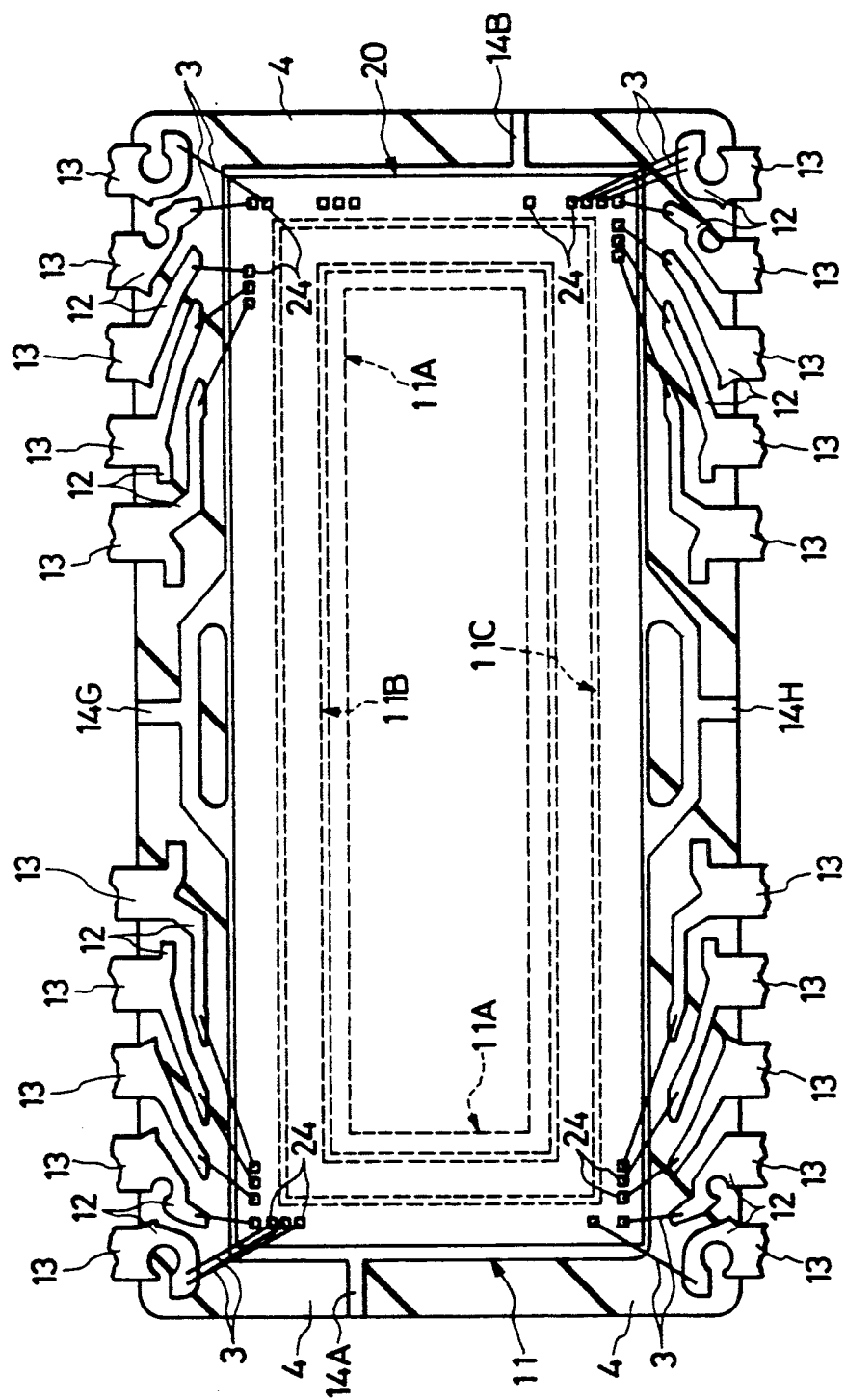
FIG. 5 is a partially-sectional plan view of a resin-encapsulated semiconductor device of the SO type which is Embodiment II of the present invention.

The resin-encapsulated semiconductor device of the SO (SOJ) type which is Embodiment II of the present invention is shown in FIG. 5 (a partially-sectional plan view).

As shown in FIG. 5, the resin-encapsulated semiconductor device of the present embodiment is provided with tab suspension leads 14G and 14H at the central parts of the respective longer latera of an oblong tab portion 11. Each of the tab suspension leads 14G and 14H is formed in the shape of letter Y which is joined with the longer latus of the tab portion 11 in two places and which is joined with a tie bar 17 in one place. The Y-shaped part of each of the tab suspension leads 14G and 14H is opened so as to permit a resin to be unitary between the front surface side of the tab portion 11 and the rear surface side thereof. That is, each of the tab suspension leads 14G and 14H is so constructed that the resin of the resin mold member 4 is not severed and that the resin is restrained from peeling off the rear surface of the tab portion 11. The longer latus parts of the tab portion 11 are parts where the stress ascribable to the water vapor pressure stated before becomes the maximum.

This resin-encapsulated semiconductor device has tab suspension leads 14A, 14B, 14G and 14H totaling four.

With the resin-encapsulated semiconductor device thus constructed, as in Embodiment I described before, the peeling of the resin from the rear surface of the tab portion 11 can be reduced, and the appearance of the cracks of the resin mold member 4 can be prevented. Moreover, even when the resin mold member 4 has cracked, the cracks can be prevented from reaching the outer surface of the resin mold member 4.

Although, in the above, the invention made by the inventor has been concretely described in conjunction with the embodiments, it is a matter of course that the present invention is not restricted to the foregoing embodiments, but that it can be variously altered within a scope not departing from the purport thereof.

By way of example, the present invention is not restricted to the DRAM having the large capacity of 4 [Mbits], but it is applicable to a resin-encapsulated semiconductor device in which a DRAM having a large of 1 [Mbit] or a large capacity of 16 [Mbits] or above is packaged.

In addition, the present invention is not restricted to the resin-encapsulated semiconductor device of the SO type, but it is applicable to resin-encapsulated semiconductor devices of the DILP type, etc.

Besides, the present invention is not restricted to the DRAM, but it is applicable to a resin-encapsulated semiconductor device in which a semiconductor chip having a built-in SRAM is molded.

Effects which are attained by typical aspects of performance of the present invention disclosed in the foregoing embodiments will be briefly described below:

In a resin-encapsulated semiconductor device, the peeling of a resin mold member from the rear surface of a tab portion as ascribable to the pressure of water vapor can be relieved, and the appearance of the cracks of the resin mold member can be prevented.

Besides, in a resin-encapsulated semiconductor device, the peeling of a resin mold member from the rear surface of a tab portion as ascribable to a binder for bonding the tab portion and a semiconductor chip can be relieved, and the appearance of the cracks of the resin mold member can be prevented.

Further, in a resin-encapsulated semiconductor device, the peeling of a resin mold member from the rear surface of a tab portion at the central parts of the longer latera of the oblong tab portion can be relieved, and the appearance or growth of the cracks of the resin mold member can be prevented.

In another typical aspect of performance of the present invention, the following effect is attained:

In a resin-encapsulated semiconductor device, it is dispensed with to extend inner leads round, and a large-sized semiconductor chip can be packaged.

In still another typical aspect of performance of the present invention, the following effect is attained:

In a resin-encapsulated semiconductor device, the short-circuiting between pieces of bonding wire, etc. can be prevented at the step of pouring a resin, and the rotation of a tab portion ascribable to the inflow of the resin can be prevented at the step.

Embodiment III

Now, packaging technology different in type from Embodiments I and II stated above will be concretely described.

Figure 6:
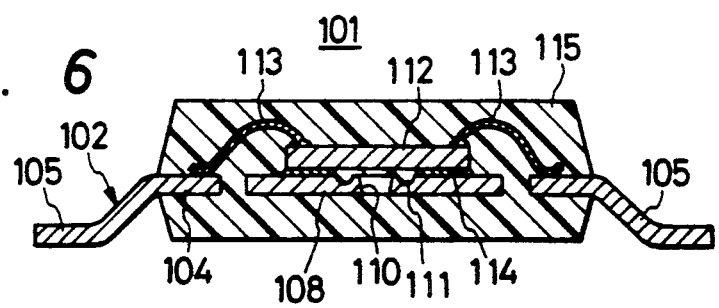
FIG. 6 is a vertical sectional view showing an IC furnished with a surface-packaging resin-molding package, which is Embodiment III of the present invention.
Figure 7:
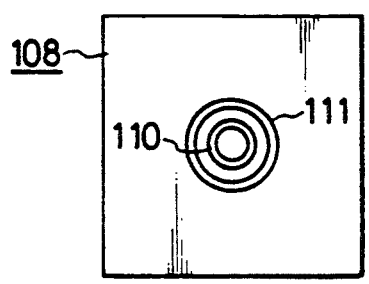
FIG. 7 is an elarged partial plan view showing the tab of the IC of the embodiment.
Figure 8:
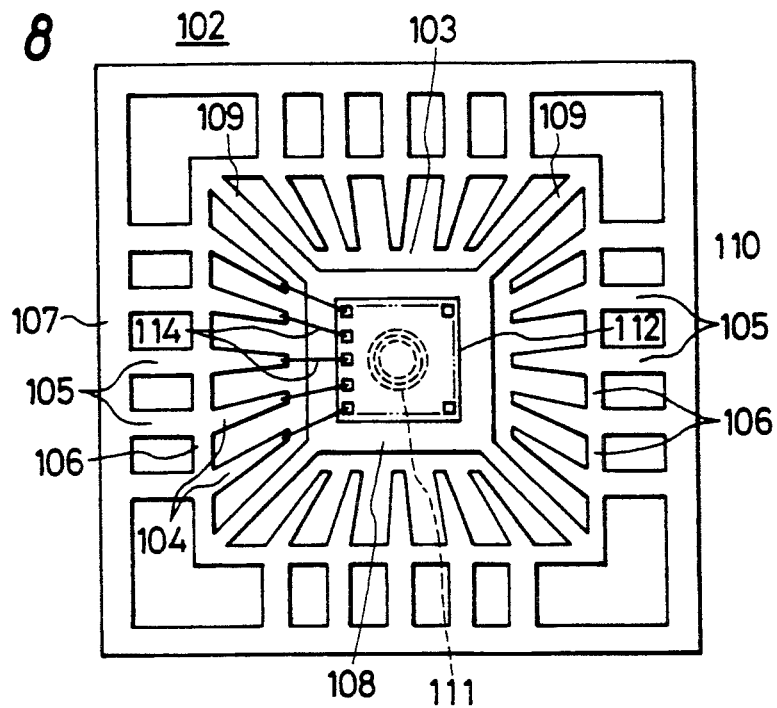
FIG. 8 is a plan view showing the intermediate stage of the manufacture of the embodiment.
Figure 9:
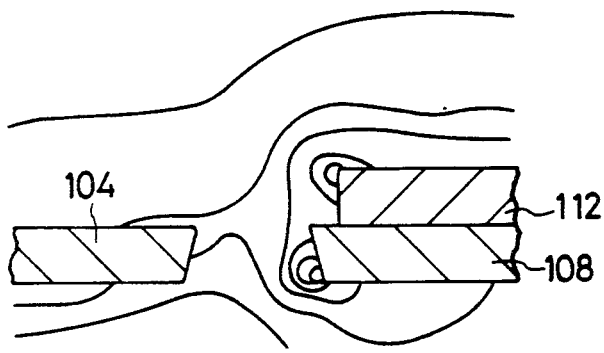
FIG. 9 is a diagram of a stress distribution inside the package for explaining the operation of the embodiment.

FIG. 6 is a vertical sectional view showing an IC including a surface-packaging resin-molding package, which is Embodiment III of the present invention, FIG. 7 is an enlarged partial plan view showing a tab in the embodiment, FIG. 8 is a plan view showing the intermediate stage of the manufacture of the embodiment, and FIG. 9 is a diagram of a stress distribution within the package for explaining the function of the embodiment.

In the present embodiment, an IC 101 including a surface-packaging resin-molding package comprises a lead frame 102, and this lead frame 102 is constructed as shown in FIG. 8 before packaging. More specifically, the lead frame 102 comprises a plurality of inner leads 104 which are disposed substantially crosswise so as to leave a substantially square cavity 103 at the intersection part of the imaginary extensions thereof; a plurality of outer leads 105 which are unitarily joined to the respective inner leads 104; a dam 106 which spans the adjacent outer leads 105, 105; a pair of outer frame portions 107 which are joined to a pair of outer lead (105) groups; a tab 108 which is arranged in the cavity 103 and which is formed in the shape of a substantially square flat plate being somewhat smaller than the cavity 103; and holding members 109 which are respectively protruded from the four corners of the dam 106 and which suspend the tab 108.

In the central part of the tab 108 formed in the shape of the substantially square flat plate, a through hole 110 is provided so as to be concentrically arranged and to penetrate this tab 108 in the thickness direction thereof. The through hole 110 has its cross-sectional configuration formed into a circular shape, and has its vertical sectional configuration formed into a tapered shape which is gradually flared toward the pellet bonding surface (hereinbelow, termed "upper surface") of the tab 108. A circular slot 111 is provided in the upper surface of the tab 108, and is arranged so as to surround the through hole 110. The lead frame 102 is formed by punching press work. In this regard, the through hole 110 can be formed simultaneously with the punching work of the tab 108 in such a way that, for example, the blade of a pressing metal mold for punching the tab 108 is previously formed with a tooth for punching the through hole 110. Alternatively, the through hole 110 can be formed by subjecting the tab 108 to an etching treatment. Also the circular slot 111 can be similarly formed.

A pellet 112 in which an integrated circuit is built is bonded on the tab 108 by a binder layer 113 which is made of a silver paste or the like, and pieces of wire 114 are respectively bonded between the electrode pads of the pellet 112 and the corresponding inner leads 104. The integrated circuit of the pellet 112 is electrically led out through the electrode pads, wire pieces 114, inner leads 104 and outer leads 105.

Here, in the operation of bonding the pellet 211 to the tab 108 by the use of the binder, this binder 113a is sporadically applied to the spots of the upper surface of the tab 108 outside the circular slot 111 as illustrated by phantom lines in FIG. 7. Subsequently, the pellet 112 is put on the tab 108 and is slidden in all directions with minute strokes. The binder 113a is spread extensively by the sliding. On this occasion, the binder 113a might overflow into the through hole 110. In the present embodiment, however, the circular slot 111 is arranged so as to surround the through hole 110, whereby the binder 113a is intercepted by this slot 111 and is therefore prevented from overflowing into the through hole 110.

The IC 101 subjected to the wire bonding is molded unitarily with a package 115 into a substantially square flat structure by employing a resin and resorting to a transfer molding process or the like. A part of the lead frame 102, the pellet 112, the wire pieces 114, and the tab 108 are sealed in non-airtight fashion by the package 115. That is, the outer leads 105 other than the tab 108, etc. are respectively protruded from the four side surfaces of the package 115. Outside the package 115, the outer leads 105 are bent downwards and are further bent in horizontal outward directions. By the way, after the molding of the package 115, the outer frame portions 107 and the dam parts between the adjacent outer leads 105, 105 are cut off.

Next, the functions of the embodiment will be described.

The articles of the IC of the above construction are subjected to a sampling inspection before shipment. As the sampling inspection, environmental tests which include a temperature cycle test and a thermal shock test are carried out. In addition, when the IC is installed on a printed-wiring circuit board or the like, it is heated by a solder dipping or reflow soldering process.

In a case where the FPPIC has undergone a thermal stress during such an environmental test or installing operation, stresses appear within the package 115 due to the differences of the coefficients of thermal expansion of the constituent materials of the IC.

Meanwhile, in a case where the outer peripheral edge of the tab is formed into sharp right angles, the internal stresses of the package concentrate near the outer edge of the rear surface of the tab 108 as illustrated in FIG. 9. Under this extent of stress concentration, however, the cracks of the package do not appear. In contrast, when a repetitive stress ascribable to repeated thermal stresses has given rise to peeling or separation at the boundary between the lower surface of the tab and the package or between the tab and the pellet, an excessive stress acts on the place of the stress concentration, and hence, cracks starting therefrom appear. Further, if at the stage of the custody of the IC after the completion of the package, moisture has invaded a gap formed by the peeling between the lower surface of the tab and the package, by any chance, then a more excessive stress is developed by the expansion of the moisture due to heating, and hence, the cracks starting from the place of the stress concentration become more liable to appear. These problems have been revealed by the inventor.

Similar researches are published in "Collection of Published Reports in 14th Reliability Symposium" issdued by a foundation, Japan Science and Technology Federation, May 29, 1984, pp. 303–306.

The stress of the lower end part of the tab increases much to induce the cracks in the package when the peeling at the boundary between the lower surface of the tab and the package has arisen in case of using the lead frame made of "42 Alloy," or when the peeling at the boundary between the pellet and the tab has arisen in case of using the lead frame made of copper. In particular, even in the case of using the lead frame made of copper which is nearly equal in the coefficient of thermal expansion to the resin employed for the package, when the peeling at the boundary between the pellet and the tab has arisen, the resin part of the package lying in contact with the side surface of the tab opens, and the excessive stress acts to bring about the cracks.

When such cracks have appeared in the IC including the surface-packaging type package, they are prone to reach the surface of the package because this package is formed thin as required for the surface packaging. Consequently, the moisture resistance of the IC degrades drastically on account of the invasion of moisture through the opening.

In contrast, in the present embodiment, the tab 108 is formed with the through hole 110, so that no cracks appear in the package 115.

More specifically, even when the boundary between the lower surface of the tab 108 and the package 115 or between the tab 108 and the pellet 112 has undergone a force urging to peel or separate the two, on account of the repetitive stress ascribable to the thermal stresses as stated before, the resin of the package filling up the through hole 110 demonstrates an anchoring effect, whereby the peeling force can be sufficiently resisted, and hence, the peeling is reliably prevented. It is as stated before that, in the absence of the peeling, even when stresses have concentrated near the outer edge of the rear surface of the tab 108, the cracks starting from the place do not appear. By the way, when the through hole 110 is previously formed into the tapered hole which flares toward the pellet mounting side of the tab, the anchoring effect heightens more.

Moreover, since the cross-sectional area of the tab 108 is decreased by the provision of the through hole 110 in this tab 108, the elongation magnitude of the tab attributed to the thermal expansion thereof is diminished to that extent. As a result, the magnitude of the concentrated stress caused at the outer peripheral edge of the tab 108 by the difference of the thermal expansions of the tab and the package resin is, in itself, suppressed to a small value. Therefore, even if the peeling as stated before should arise within the package 115, the cracks starting from the place of the stress concentration will be prevented from appearing.

According to the embodiment, the following effects are attained:

(1) By providing a tab with a through hole which penetrates the tab in the thickness direction thereof, the tab and a package can be prevented from peeling or separating due to a stress attendant upon thermal stresses, so that the cracks of the package starting from the outer peripheral edge of the tab can be prevented from appearing.

(2) Owing to the effect (1), the appearance of the cracks in the package can be prevented, so that the surface-packaging type package can be made still thinner and smaller, and the integration density and packaging density of an IC which includes the surface-packaging type package can be heightened still more.

(3) By forming the through hole into a tapered hole which flares toward the pellet mounting surface of the tab, an anchoring effect based on the solid part of a resin filling up the tapered hole can be enhanced, so that the peeling between the tab and the package is reliably prevented, whereby the cracks of the package starting from the outer edge of the tab can be more reliably prevented from appearing.

(4) By disposing a circular slot outside the through hole, a binder can be prevented from overflowing into the through hole at a pellet bonding step, so that the resin can be reliably packed in the through hole.

(5) The through hole can be formed simultaneously with the tab at the punching press work of a lead frame, so that the lowering of a job efficiency can be restrained.

Embodiment IV

Figure 10:
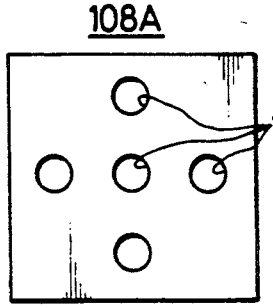
FIGS. 10, 11 and 12 show Embodiments IV, V and VI, respectively, and are enlarged partial plan views corresponding to FIG. 7.

FIG. 10 shows Embodiment IV of the present invention, and it is an enlarged partial plan view corresponding to FIG. 7.

The point of difference of the present embodiment IV from the foregoing embodiment III is that five through holes 110A are respectively arranged and provided in the four latus parts and substantially the central part of a tab 108A along the center lines thereof. The functions and effects of the present embodiment are substantially the same as those of the foregoing embodiment III.

Embodiment V

Figure 11:
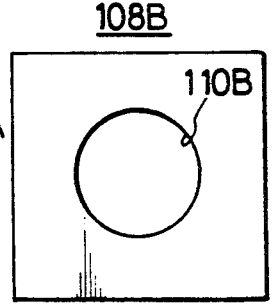

FIG. 11 shows Embodiment V of the present invention, and it is an enlarged partial plan view corresponding to FIG. 7.

The point of difference of the present embodiment V from the foregoing embodiment III is that a through hole 110B is concentrically arranged at the central part of a tab portion 108B and is provided into a larger diameter.

According to the present embodiment V, the tab 108B is formed with the through hole 110B in a larger area, so that the elongation of the tab 108B attributed to the thermal expansion thereof becomes very slight. Accordingly, a stress attendant upon the elongation is suppressed to be small.

Embodiment VI

Figure 12:
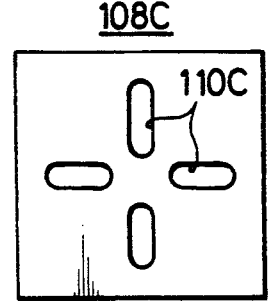

FIG. 12 shows Embodiment VI of the present invention, and it is an elarged partial plan view corresponding to FIG. 7.

The point of difference of the present embodiment VI from the foregoing embodiment III is that substantially elliptical through holes 110C numbering four are respectively arranged in correspondence with the central parts of the four latera of a tab 108C and along the center lines of this tab and are provided so as to cut away the tab 108C in a larger area.

According to the present embodiment VI, influence by the thermal expansion of the tab 108C is extraordinarily suppressed as in the preceding embodiment V, so that a stress attendant upon the influence is suppressed to be small.

Although, in the above, the invention made by the inventor has been concretely described in conjunction with the embodiments, it is a matter of course that the present invention is not restricted to the foregoing embodiments, but that it can be variously altered within a scope not departing from the purport thereof.

By way of example, the cross-sectional configuration of the through hole is not restricted to round shapes, but it may well be any of regular polygonal shapes such as a regular square and a regular hexagon.

The through hole is not restricted to the tapered hole, and the circular slot may well be omitted.

In addition, for the purpose of dispersing stresses which concentrate on the pellet, it is desirable to form chamfers at the end parts of the pellet. Further, stresses are also caused by the peeling between the tab and the pellet. It is therefore a matter of course that the adhesive property between the two should desirably be strengthened.

Although, in the above, the invention made by the inventor has been principally described as to the cases of application to the IC including the surface-packaging resin-molding package as forms the background field of utilization, the present invention is not restricted thereto but is applicable to general electron devices such as ICs including other resin-molding packages.

An effect which is attained by a typical aspect of performance of the present invention will be briefly described below:

A tab which is a pellet mounting portion is provided with a through hole so as to penetrate the tab in the thickness direction thereof, whereby the peeling between the tab and a resin-molding package attributed to a thermal stress can be prevented from occurring, and hence, package cracks starting from the corners of the tab can be prevented from appearing.

Embodiment VII

This embodiment elucidates the detailed process of the preceding embodiment VI, and consists in the application of the slit structure of the embodiment VI to a packaging process of another type. Accordingly, the local shapes of slits or holes provided in a tab (die pad) are quite the same as shown in FIG. 12.

It is needless to say that the process of the present embodiment is similarly applicable to the foregoing embodiments I-V.

Now, the construction of the present invention will be described in conjunction with one embodiment in which the present invention is applied to a resin-encapsulated semiconductor device of the mini square package (MSP) type being the flat-packaging type.

Throughout the drawings for describing the embodiment, the same symbols are assigned to portions having identical functions, and they shall not be repeatedly explained.

The schematic construction of an MPS type resin-encapsulated semiconductor device which is Embodiment VII of the present invention is shown in FIG. 13 (a sectional view).

As shown in FIG. 13, the resin-encapsulated semiconductor device 201 is such that a semiconductor chip 204 mounted on the front surface of a tab portion 202A, and inner lead portions 202B are molded in a resin 206.

Figure 16:
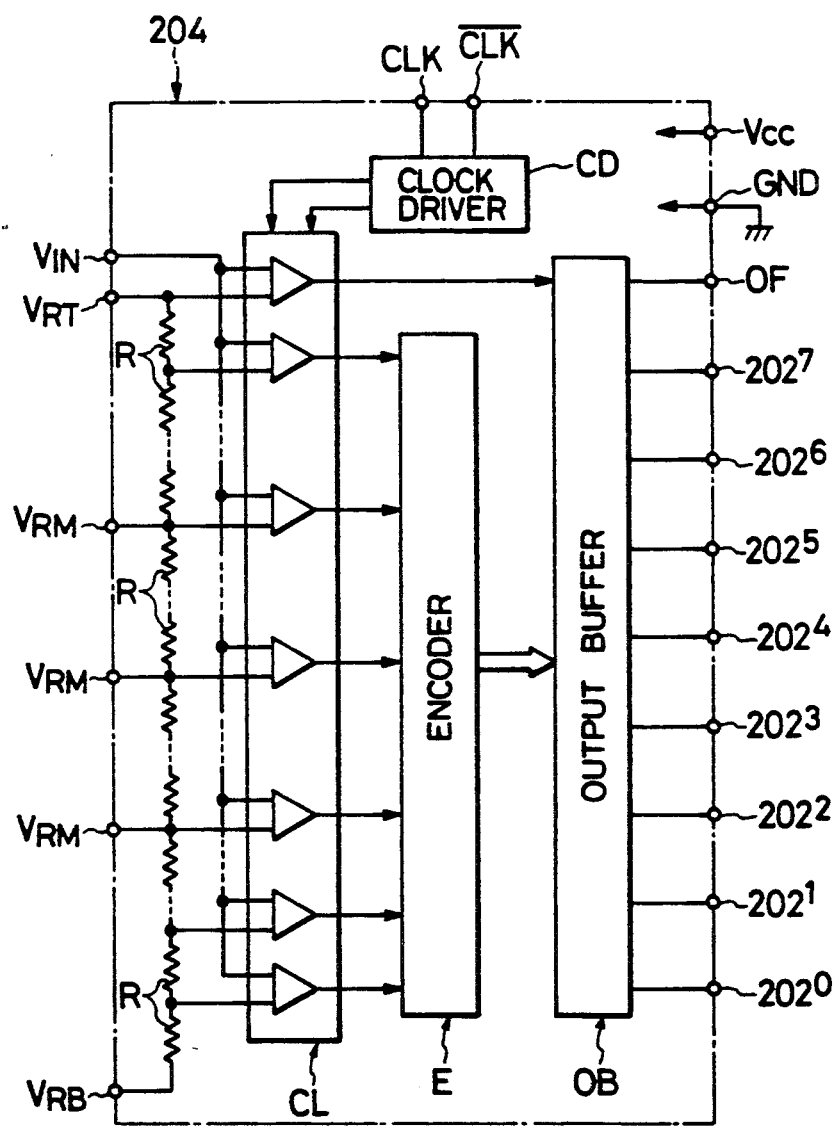
FIG. 16 is a block arrangement diagram of the semiconductor chip.

As shown in FIG. 14 (a chip layout plan), FIG. 15 (a sectional view of essential portions) and FIG. 16 (a block arrangement diagram), the semiconductor chip 204 has a parallel analog-to-digital conversion (A/D) function. As illustrated in FIGS. 14 and 16, the semiconductor chip 204 principally comprises comparator & latch circuits CL, an encoder circuit E, an output buffer circuit OB, a clock driver circuit CD, and reference resistors R.

The comparator & latch circuits CL are arranged at the central part of the semiconductor chip 204 formed in a rectangular shape as shown in FIG. 14. These comparator & latch circuits CL are constructed in such a way that a plurality of unit comparator & latch circuits are arranged in a column direction so as to form a row, and that four such rows are disposed in a row direction.

The encoder circuit E and the output buffer circuit OB are arranged at the right peripheral part of the semiconductor chip 204 shown in FIG. 14.

The clock driver circuit CD is arranged at the peripheral part of the left upper part of the semiconductor chip 204 shown in FIG. 14.

The reference resistors R are constructed so as to extend in the column direction along one end of each column of the comparator & latch circuits CL. These reference resistors R are extended in a meandering shape in order to reduce the occupation area thereof.

A plurality of external terminals (bonding pads) 204C arranged along each of the four latera of the semiconductor chip 204 shown in FIG. 14 construct the corresponding ones of terminals shown in FIG. 16. Referring to FIG. 16, symbols CLK and $\overline{\text{CLK}}$ denote clock signal terminals. Symbol $V_{CC}$ denotes a power source voltage terminal, and symbol GND a ground potential terminal. Shown at symbol $V_{IN}$ is an analog input signal terminal. Each of symbols $V_{RT}$, $V_{RM}$ and $V_{RB}$ denotes a reference voltage input terminal. Symbols $202^0$-$202^7$ and OF denote digital output signal terminals, respectively.

As shown in FIG. 15, semiconductor elements which constitute the comparator & latch circuits CL, etc. are formed in the principal surface part of an $n^-$-type epitaxial layer 204P which is stacked on the principal surface of a $p^-$-type semiconductor substrate 204A made of single-crystal silicon. The semiconductor elements are surrounded with the semiconductor substrate 204A and element isolation regions formed by $p^+$-type semiconductor regions 204Q, and have their shapes defined. One of the semiconductor elements is an n-p-n type bipolar transistor Tr whose collector region is the epitaxial layer 204P, whose base region is a p-type semiconductor region 204R and whose emitter region is an $n^+$-type semiconductor region 204S. Wiring leads 204I, 204J and 204K are respectively connected to the emitter region, base region and collector region through contact holes (with no symbols assigned thereto) which are formed in an inter-layer insulator film 204B.

All the wiring leads 204I, 204J and 204K are formed by the step of forming a first layer of wiring in a manufacturing process for the semiconductor chip 204. They are made of an aluminum alloy material (Al-Cu) which is doped with the copper (Cu) element for reducing the phenomenon of electromigration or the phenomenon of stress migration. By way of example, the Cu element is added in an amount of about 1-5 [weight-%]. Alternatively, all the wiring leads 204I, 204J and 204K may well be made of an aluminum alloy material (Al-Cu-Si) which is doped with the Cu element mentioned above and the silicon (Si) element for preventing the phenomenon of aluminum spikes. Further, they may well be made of an aluminum alloy material which is doped with the palladium (Pd) element, the titanium (Ti) element or the like as an element for reducing the aforementioned migration phenomenon. In particular, since the bipolar transistor Tr is driven with a current greater than that of a MOSFET, the wiring leads 204I etc. need to be doped with the element or elements explained above.

The reference resistor R is made of a wiring lead 204H which is formed by the step of forming the first layer of wiring.

The inter-layer insulator film 204B is made of, for example, a silicon oxide film.

On the wiring leads 204I etc. formed by the step of forming the first layer of wiring, wiring leads 204L-204O formed by the step of forming a second layer of wiring in the manufacturing process are laid through an inter-layer insulator film 204F. The wiring leads 204L-204O are made of the same alloy material as that of the wiring leads 204I etc. formed by the step of forming the first layer of wiring.

The external terminals 204C are formed by the step of forming the second layer of wiring. One of the external terminals 204C is connected to a subbing layer 204G through a contact hole (with no symbol assigned thereto) which is formed in the inter-layer insulator film 204F. The subbing layer 204G is formed by the step of forming the first layer of wiring. The surface of the external terminal 204C is exposed through an opening 204E which is formed in a passivation film 204D.

The inter-layer insulator film 204F is formed of, for example, a polyimide resin material. The passivation film 204D is formed of, for example, a polyimide resin material.

As shown in FIG. 13, the semiconductor chip 204 is mounted on the front surface of the tab portion 202 through a binder 203. As the binder 203, to the end of permitting it to mount the pellet with a low temperature process, there is employed a quick-hardening type epoxy resin adhesive whose composition conists of, for example, a bisphenol type epoxy resin (6% by weight) and a phenol novolac type epoxy resin (6% by weight) as principal resin components, imidazoles (1% by weight) as a hardening promoter, butyl cellosolve or N-methyl-2-pyrrolidone (15% by weight) as a solvent, and silver powder (72% by weight) as a filler.

The external terminals 204C of the semiconductor chip 204 are connected to the inner lead portions 202B through pieces of bonding wire 205. The bonding wire 205 is made of copper (Cu: a purity of, for example 99.999 [%]). That is, the bonding wire 205 should preferably be made of the same material as the Cu element which reduces the migration and with which the external terminals 204C of the semiconductor chip 204 are doped. A copper ball 205A is formed at that end of the bonding wire piece 205 which is connected to the external terminal 204C. The copper ball 205A of the bonding wire piece 205 is connected to the external terminal 204C by thermocompression jointly employing ultrasonic vibrations. That is, the bonding wire piece 205 is connected by wedge ball bonding. Similarly, the bonding wire piece 205 is connected to the inner lead portion 202B by the thermocompression jointly employing the ultrasonic vibrations.

Figure 17A:
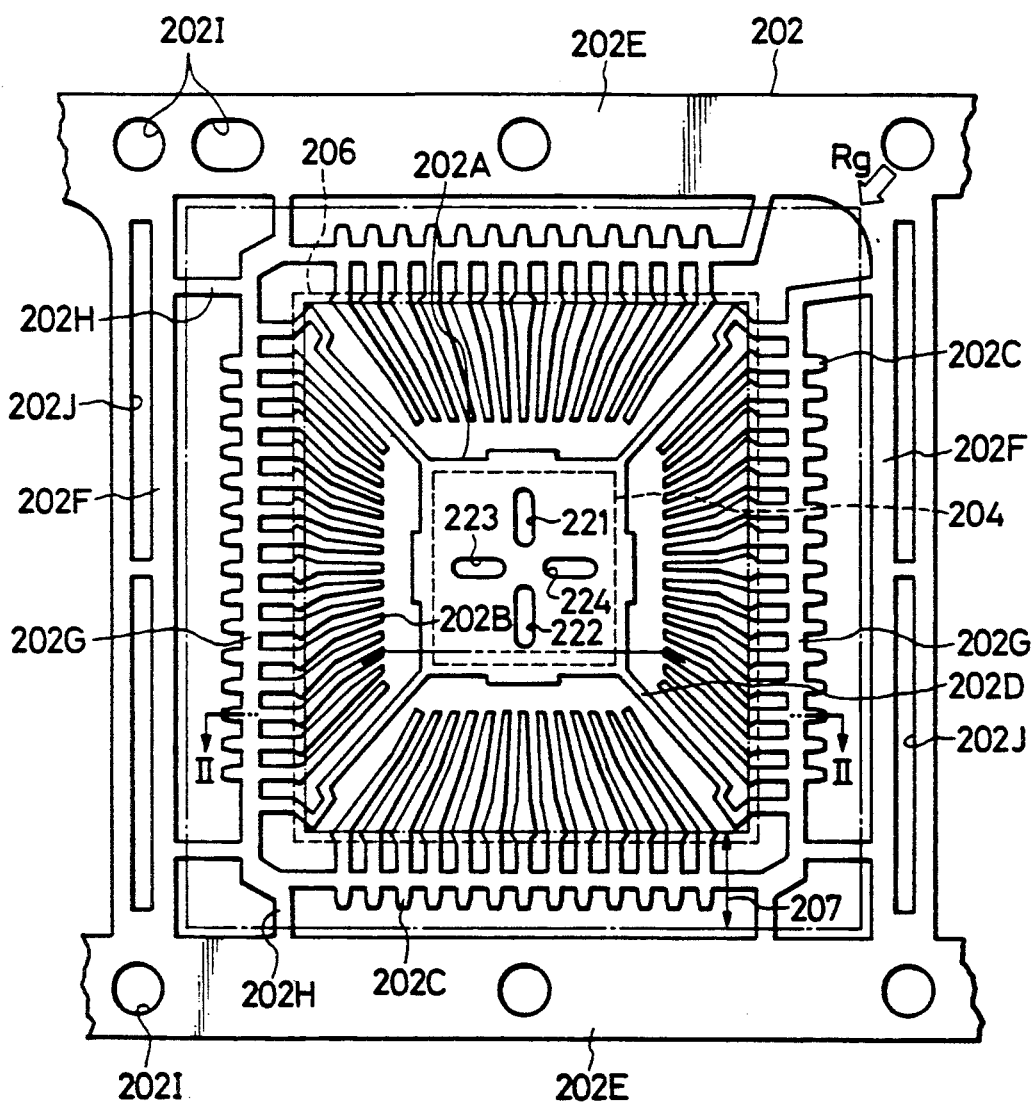
FIGS. 17A and 17B are plan views showing the constructions of one unit and more units of a lead frame which constitutes the resin-encapsulated semiconductor device, respectively.

As shown in FIG. 17A (a plan view), the tab portion 202A, the inner lead portion 202B, and outer lead portions 202C are constructed to be unitary in the state of a lead frame 202.

The lead frame 202 of the single resin-encapsulated semiconductor device 201 is constructed inside an area in FIG. 17A as enclosed with two outer frame portions 202E which oppose vertically and which extend laterally and two inner frame portions 202F which oppose laterally and which extend vertically. Such lead frames 202 are constructed as repeated patterns in the direction in which the outer frame portions 202E extend. Both the inner frame portions 202F are formed to be unitary with the corresponding outer frame portions 202E.

The tab portion 202A lies substantially at the central part of the lead frame 202, and has a square shape. The tab portion 202A is supported by the inner frame portion 202F through two tab suspension leads 202D which extend upwards and downwards, respectively. As shown in FIG. 13, the tab portion 202A is constructed at a position lower than the inner lead portions 202B. More specifically, since a difference arises between the level of the external terminals 204C and that of the inner lead portions 202B due to the thickness of the semiconductor chip 204, the tab portion 202A is constructed so as to moderate the level difference in the bonding operation. That is, the tab portion 202A is located at the lower position in order to facilitate connecting each bonding wire piece 205 to both the external terminal 204C and the inner lead portion 202B.

The inner lead portions 202B in each of four groups are constructed so as to lie near the corresponding latus of the tab portion 202A on one end side of the group and to extend radiately from the same latus on the other end side. On the other end side of the group of the inner lead portions 202B, one end side of the corresponding group of the outer lead portions 202C is constructed to be unitary. The outer lead portions 202C are constructed so as to protrude from the four latera of the square resin 206 which is enclosed with a dotted line in FIG. 17A. In other words, the resin-encapsulated semiconductor device 201 of the present embodiment is so configured that the outer lead portions 202C protrude in the four directions of upward, downward, rightward and leftward directions. The inner lead portions 202B and the outer lead portions 202C are supported by the outer frame portions 202E or the inner frame portions 202F through tie bars 202G unitary with the outer lead portions 202C and support leads 202H unitary with the tie bars 202G. The other end side of each group of the outer lead portions 202C is not constructed to be unitary with the outer frame portion 202E or the inner frame portion 202F, but is spaced therefrom a predetermined distance.

The outer frame portion 202E of the lead frame 202 is provided with holes 202I for transportation or for positioning, at predetermined intervals in the extending direction thereof. On the other hand, the inner frame portion 202F is provided with slits 202J for relieving stresses which arise at the step of encapsulation with the resin 206.

The lead frame 202 is made of a precipitation-hardening copper material, for example, one which contains 0.05-0.15 [%] of zirconium (Zr) (the balance being copper). The precipitation-hardening copper material has a high electric conductivity as well as a high tensile strength, and in particular, it is excellent in the point of bondability in the case of connecting the bonding wire 205 which is made of a copper material or an alloy material principally containing copper. Alternatively, it is allowed to use a precipitation-hardening copper material which contains about 0.50-0.60 [%] of zirconium and about 0.20-0.30 [%] of chromium (Cr).

A solder plating layer 207 formed by previous solder plating is deposited on the surfaces of the outer lead portions 202C of the resin-encapsulated semiconductor device 201 constructed as described above. In contrast, the front surface of the tab portion 202A and the front surfaces of the inner lead portions 202B are not provided with plating layers, namely, silver plating layers for enhancing bondabilities. The solder plating layer 207 is formed so as to enter the sides of the inner lead portions 202B in a component corresponding to the positioning deviation thereof relative to the resin 206, lest the surfaces of the outer lead portions 202C should be exposed. In addition, since the other end side of each group of the outer lead portions 207 is spaced from the outer frame portion 202E or the inner frame portion 202F, the solder plating layer 207 is formed so as to cover the outer lead portions 202C entirely up to the extreme ends thereof on the other end side. The solder plating layer 207 is formed between an inner dot-and-dash line and an outer dot-and-dash line in FIG. 17A.

Figure 17B:
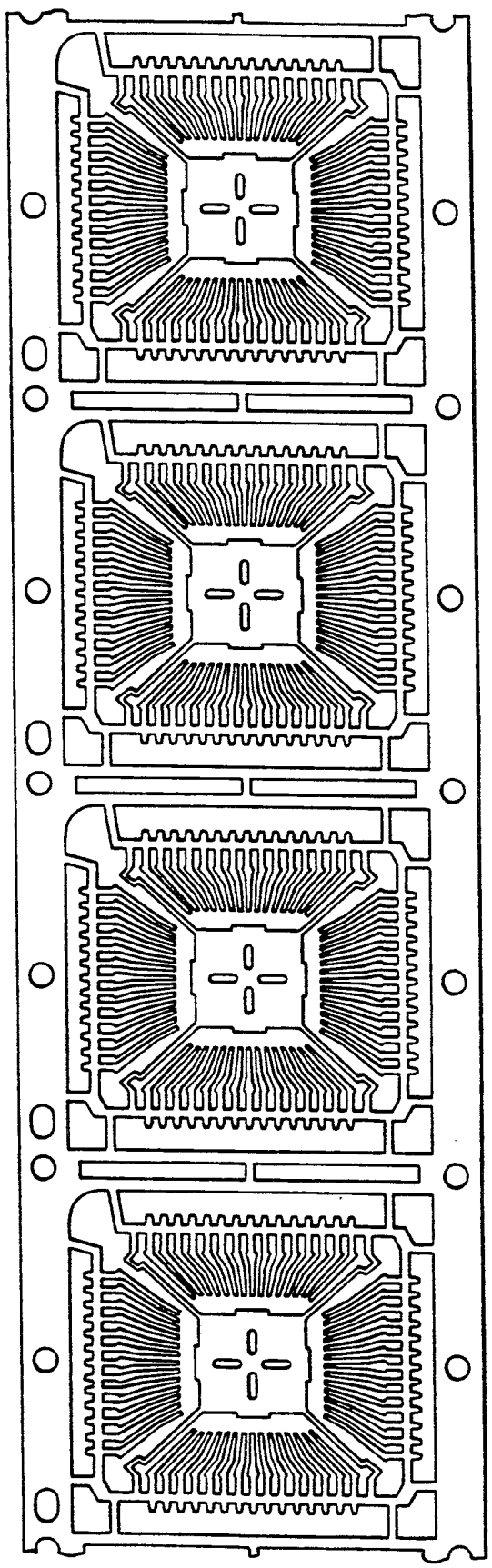

In FIG. 17A, numerals 221–224 indicate slits which are formed in the tab portion (die pad) 202A likewise to the through holes or slits 110C in FIG. 12. In order to prevent the peeling of the molding resin at the rear surface of the large-sized tab 202A attributed to the vaporization of dew condensation water, the rear surface of the tab 202A acting, in effect, as an integral flat surface needs to be divided by the slits (through holes). In case of this example, the size of the semiconductor chip 204 is approximately 8 mm × 8 mm, and that of the tab 202A is approximately 8.3 mm × 8.3 mm. FIG. 17A and FIG. 17B (a plan view of the lead frames) are drawn in similar fashion by making only the scales of enlargement different without changing the dimensional ratios of the various portions. Accordingly, the actual dimensions of the various portions can be proportionally calculated on the basis of the size of the chip.

Further, the vertical sectional configuration of each of the slits 221–224 is put into a shape which flares toward the chip as illustrated in FIG. 6, whereby the bite property of the molding resin can be improved.

As the manufacturing process of the resin-encapsulated semiconductor device 201, a low temperature process (at, for example, 160 [° C.] or so) is used. The solder plating layer 207 is formed of a high-melting solder so as not to melt during the low temperature process. By way of example, the solder plating layer 207 is formed of 75–95 [%] of (Pb) and 25–5 [%] of tin (Sn). It is deposited by, for example, a solder plating method employing a boron fluoride tank.

The resin 206 for molding the semiconductor chip 204, etc. is poured from a right upper part as seen from an arrow Rg indicative of the position of a resin gate in FIG. 17A. As the resin 206, a low-temperature hardening resin which can be hardened at a low temperature owing to a high hardening rate is used in order to prevent the solder plating layer 207 from melting. To the end of raising the hardening rate, the low-temperature hardening resin contains a hardening catalyst in an amount which is about 1.5–3.0 times as large as an ordinary amount.

In this manner, in the resin-encapsulated semiconductor device 201, the external terminals 204C of the semiconductor chip 204 are made of the aluminum alloy material which is doped with the element (for example, Cu) for reducing the migration, and the bonding wire 205 is made of the metal material (Cu or the alloy thereof) which has a hardness substantially equal to that of the external terminals 204C, whereby the difference between the hardnesses of the external terminals 204C and the bonding wire 205 is slight, and the alloy layer (Al - Cu alloy layer) of the external terminal 204C and the bonding wire piece 205 is easily formed at the boundary of the two by the thermocompression, so that the bondability (an initial bonding property) can be enhanced.

In addition, the bonding wire 205 is made of Cu or the alloy material whose principal component is Cu, whereby it is made of the same material as the Cu element with which the external terminals 204C are doped, so that the aforementioned alloy layer can be formed more easily, and the bondability can be enhanced still more.

Besides, the lead frame 202 of the resin-encapsulated semiconductor device 201 is made of the precipitation-hardening copper material, whereby the bonding wire (Cu) 205 and the lead frame (precipitation-hardening copper material) 202 are formed of the same material, so that the bondability between the two can be enhanced.

Next, the manufacturing process of the resin-encapsulated semiconductor device 201 will be briefly described with reference to FIGS. 18 thru 23 (sectional views of the resin-encapsulated semiconductor device showing respective steps of manufacture). The sections of the device are taken along line II—II in FIG. 17A for the sake of simplicity.

First, a lead frame 202 formed of a precipitation-hardening copper material (containing 0.05–0.15 [%] of Zr) is prepared.

Subsequently, as shown in FIG. 18, a solder plating layer 207 is formed on the surfaces of outer lead portions 202C except a tab portion 202A and inner lead portions 202B by previous solder plating. As stated before, a high-melting solder (which melts at 183°–305 [° C.]) is used for the solder plating layer 207. Incidentally, the outer frame portions 202E and inner frame portions 202F of the lead frame 202 are not shown in FIGS. 18, 19, 21 and 22.

At the next step, the tab portion 202A of the lead frame 202 is molded to a position which is lower than the inner lead portions 202B.

At the next step, as shown in FIG. 19, a semiconductor chip 204 is mounted on the front surface of the tab portion 202A through a binder 203 (pellet mounting). Since the binder 203 employed is a quick-hardening type epoxy resin adhesive as stated before, it can be hardened by a low temperature process at a temperature of about 160 [° C.] for a short time of about 1–60 [minutes].

Figure 20:
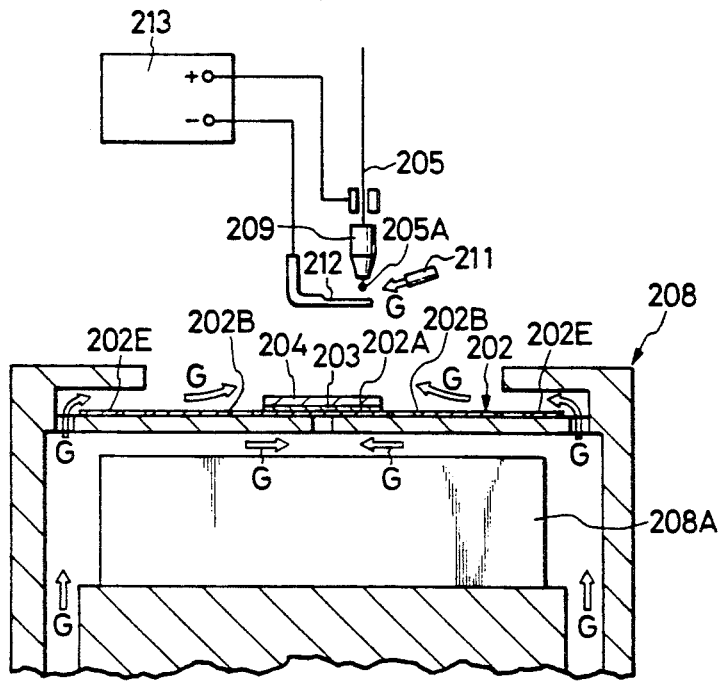

Subsequently, the lead frame 202 with the semiconductor chip 204 mounted on the front surface of the tab portion 202A is transported to a bonding table 208 which is shown in FIG. 20 and in which a heat block 208A is built. Since the bonding table 208 adopts a low temperature process by which the solder plating layer 207 is not melted, it performs the heating of the lead frame 202, etc. by the heat block 208A at temperatures of about 100°–180 [° C.]. The bonding table 208 is constructed so as to form a reducing atmosphere, so that the lead frame 208, especially the surfaces of the tab portion 202A and inner lead portions 202B where the copper material is directly exposed is/are not oxidized. The reducing atmosphere is formed by supplying a reducing gas from the lower side of the bonding table 208 as indicated by an arrow G in FIG. 20. This reducing atmosphere is formed by, for example, mixing about 90 [%] of nitrogen gas and about 10 [%] of hydrogen gas. Alternatively, it may well be formed by employing argon gas as a principal ingredient.

A bonding apparatus is disposed at a position which confronts the lead frame 202 transported to the bonding table 208. The bonding apparatus principally comprises a capillary 209 supported by a bonding arm (not shown), a clamper 210, an arc electrode 212, an arc striking circuit 213, and a reducing gas-supplying nozzle 211. The capillary 209 is constructed so as to secure bonding wire 205 compressedly (by thermocompression) to both the external terminal 204C and inner lead portion 202B of the semiconductor chip 204. Ultrasonic vibrations from an ultrasonic vibrator which is disposed on the bonding arm are transmitted to the capillary 209. The clamper 210 is constructed so as to sandwich the bonding wire 205 therein and to control the feed of this bonding wire. The arc striking circuit 213 sets the arc electrode 212 at a minus potential and sets the fore end of the bonding wire 205 in the feed direction thereof at a plus potential through the clamper 210, thereby to strike electric arcs across the two portions. In this way, a copper ball 205A can be formed at the fore end part of the bonding wire 205. The reducing gas-supplying nozzle 211 is so constructed that the reducing gas G is blown against the part for forming the copper ball 205A, thereby to prevent the surface of the copper ball 205A from oxidizing. The copper ball 205A can be formed into a more appropriate globular shape in the reducing atmosphere than in the air. The reducing gas G is formed by, for example, mixing a slight amount of hydrogen gas into argon gas.

Figure 21:
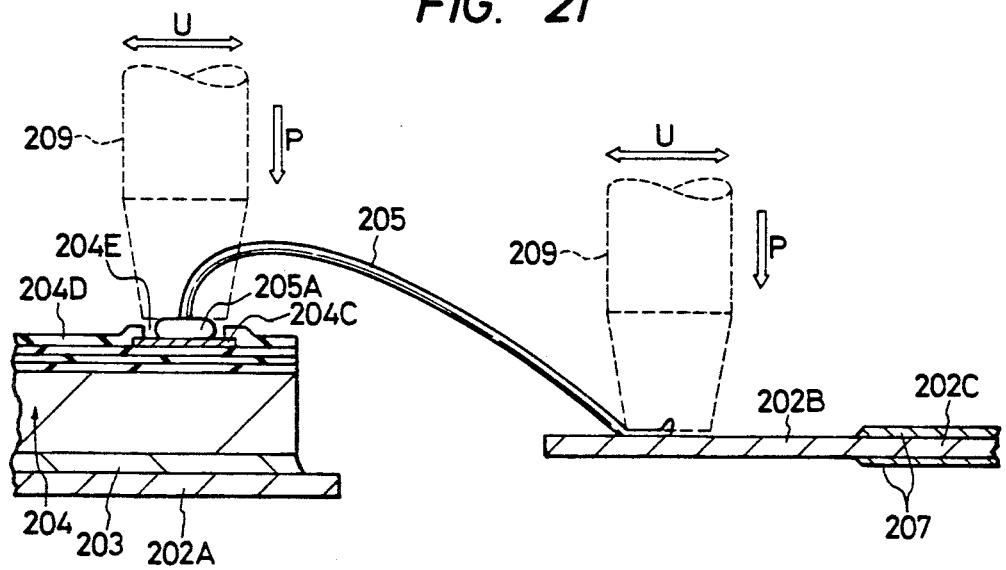

When the copper ball 205A has been formed at the fore end of the bonding wire 205 on the feed side thereof by the bonding apparatus shown in FIG. 20, the bonding wire 205 is bonded to the external terminal 204C of the semiconductor chip 204 through the copper ball 205A by the capillary 209 as illustrated in FIG. 21 (first bonding). The bonding of the copper ball 205A is carried out in such a way that the compression (thermocompression) of the capillary 209 in the direction of an arrow P is combined with the ultrasonic vibrations thereof in the directions of a double-headed arrow U. That is, the bonding wire 205 is bonded by wedge ball bonding. The connection between the external terminal 204C and the bonding wire 205 can be endowed with good bondability because the bonding wire 205 is made of a Cu material or an alloy material principally containing Cu as stated before. Subsequently, the hinder end side of the bonding wire 205 in the feed direction thereof is bonded to the front surface of the inner lead portion 202B (second bonding). The connection between the inner lead portion 202B and the bonding wire 205 is endowed with a good bondability because the lead frame 202 is made of the precipitation-hardening copper material as stated before. Since the ball bonding connects the external terminal 204C and the copper ball 205A in which the cross-sectional area of the bonding wire 205 is increased, it can enhance the bondability more.

Figure 22:
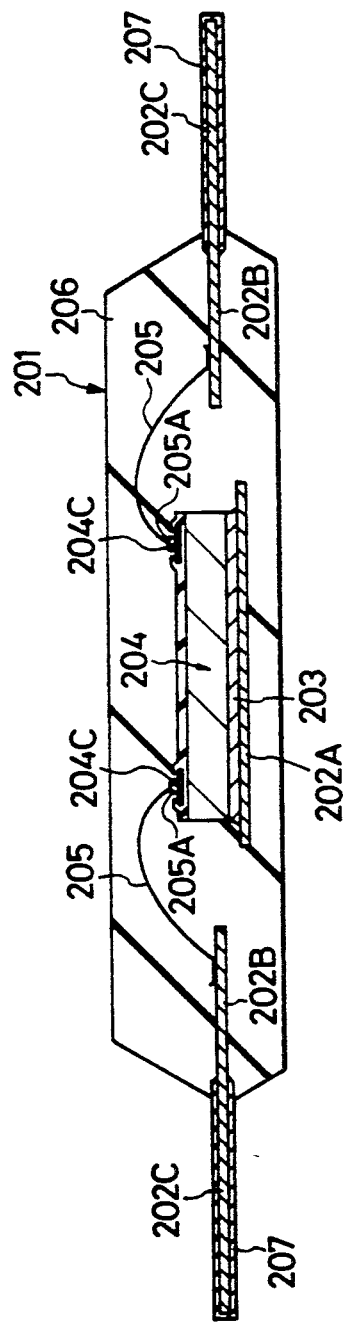

At the next step, the tab portion 202A, inner lead portions 202B, semiconductor chip 204 and bonding wire pieces 205 are molded in a resin 206 as illustrated in FIG. 22. As stated before, a low-temperature hardening resin is used for the resin 206. In order to prevent the solder plating layer 207 from melting, the resin 206 is hardened by a low temperature process which performs molding at a temperature of about 160 [° C.] for about 1-3 [minutes] and post-curing at about 160 [° C.]for about 4-16 [hours].

At the next step, although no illustration is made, the lead frame 202 is molded by cutting off the outer frame portions 202E, inner frame portions 202F, tie bars 202G, etc. thereof. Then, the resin-encapsulated semiconductor device 201 is completed as shown in FIG. 13.

Figure 23:
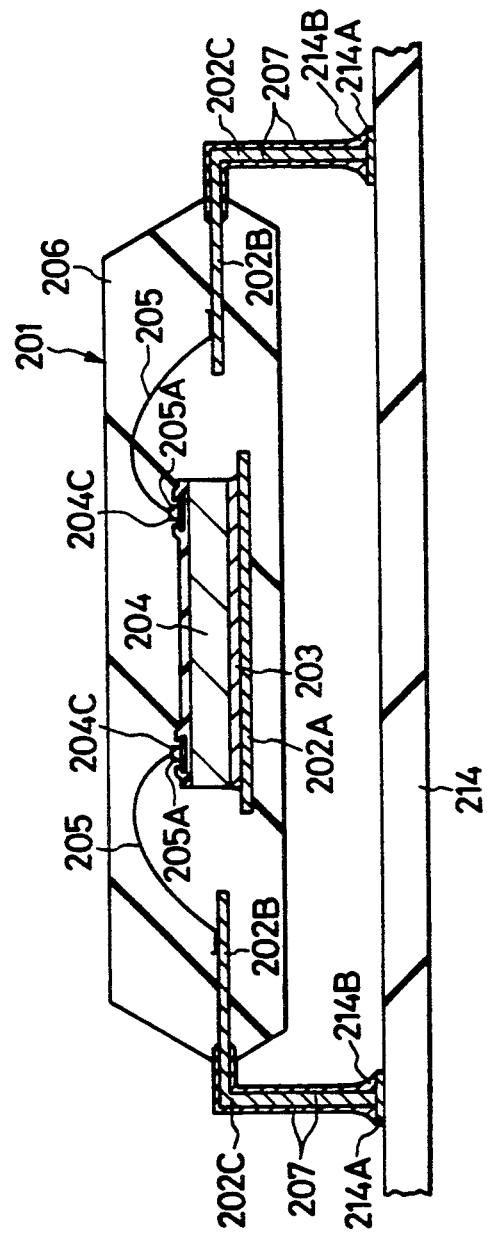

Thereafter, as shown in FIG. 23, the resin-encapsulated semiconductor device 201 is mounted on an installing circuit board (for example, printed-wiring circuit board) 214. The mounting is carried out in such a way that the outer lead portions 202C of the resin-encapsulated semiconductor device 201 are connected to the wiring leads (terminals) 214A of the installing circuit board 214 through solder layers 214B, and that the solder layers 214B are subjected to reflowing. The solder layers 214B are formed by solder printing. The reflowing is conducted at a low temperature of about 220°-230 [° C.] for about 15-30 [seconds] by the use of an infrared furnace. This reflowing can melt the solder layers 214B, but cannot melt the solder plating layer 207 formed on the surfaces of the outer lead portions 202C.

In this manner, in the resin-encapsulated semiconductor device 201, the tab portion 202A and the inner lead portions 202B are not provided with plating layers, and the outer lead portions 202C are provided with the previous solder plating layer 207 of only one sort. Thus, since the plating layers of the tab portion 202A and the inner lead portions 202B are not formed, the product cost of the resin-encapsulated semiconductor device 201 can be curtailed, and since the previous solder plating method is adopted, it is possible to achieve shortening the period of time required for the completion of the product and enhacing the moisture resistance of the product.

By the way, in the present invention, the lead frame 202 may well be constructed in such a way that the whole surface of a solid-solution hardening type copper material (containing Sn, Ni, Fe etc.) or an iron-nickel alloy material is provided with a copper plating layer or a tin-nickel alloy plating layer as a subbing plating layer. The subbing plating layer is formed in order to prevent the precipitation of Sn, Ni, Fe or the like contained in the solid-solution hardening type copper material and to enhance the bondability. In this case, the subbing plating layer is exposed on the surfaces of the tab portion and those of the inner lead portions, and a solder plating layer is deposited on the surfaces of the outer lead portions through the subbing plating layer.

Although, in the above, the invention made by the inventor has been concretely described in conjunction with the embodiments, it is a matter of course that the present invention is not restricted to the foregoing embodiments, but that it can be variously altered within a scope not departing from the purport thereof.

By way of example, the present invention is applicable to resin-encapsulated semiconductor devices of flat-packaged types other than the foregoing, e.g., the SOP and PLCC types.

In addition, the present invention is applicable to resin-encapsulated semiconductor devices of the DIP type, etc. being pin insertion types.

Besides, the present invention is applicable to semiconductor devices in each of which a plurality of semiconductor chips are installed on an identical installing circuit board, whereupon the external terminals of the semiconductor chips and the terminals (inner lead portions) of the installing circuit board are connected by pieces of bonding wire.

What is claimed is:

1. A lead frame for a semiconductor device comprising:
   a quadrangular-shaped chip supporting member for mounting a semiconductor chip on a chip mounting surface thereof, wherein said chip supporting member has a pair of first sides facing each other and a pair of second sides facing each other;
   at least two first elongated through-holes arranged on a line parallel to one of said second sides, and at least two second elongated through-holes arranged on line parallel to one of said first sides; and a plurality of leads arranged adjacent to said chip supporting member, wherein said chip supporting member includes adhering portions for adhering said semiconductor chip thereon, each surrounded by one of said first sides, one of said second sides, one of said first through-holes and one of said second through-holes, and wherein one of said adhering portions is joined with another of said adhering portions at a portion of said chip supporting member located between said first elongated through-holes.

2. A lead frame according to claim 1, wherein a groove is formed in said chip mounting surface of said chip supporting member to surround at least one of said through-holes.

3. A resin-encapsulated semiconductor device comprising:

a quadrangular-shaped semiconductor chip having a main surface and rear surface, wherein a plurality of external terminals are arranged at a peripheral area of said main surface;

a quadrangular-shaped chip supporting member for mounting said semiconductor chip on a chip mounting surface thereof, wherein said chip supporting member has a pair of first sides facing each other and a pair of second sides facing each other;

at least two first elongated through-holes arranged on a line parallel to one of said second sides, and at least two second elongated through-holes arranged on a line parallel to one of said first sides;

a binder layer which adheres said rear surface of said chip and said chip supporting member;

a plurality of leads arranged adjacent to said external terminals, each of said leads having inner and outer lead portions, respectively;

a plurality of wires electrically connected between said external terminals and said inner lead portions, respectively; and a resin member for encapsulating said semiconductor chip, said chip supporting member, said inner lead portions and said wires, wherein said chip supporting member includes adhering portions surrounded by one of said first sides, one of said second sides, one of said first through-holes and one of said second through-holes, and wherein one of said adhering portions is joined with another adhering portions at a portion of said chip supporting member located between said first elongated through-holes.

4. A resin-encapsulated semiconductor device according to claim 3, wherein said binder layer is a silicon rubber type binder.

5. A resin-encapsulated semiconductor device according to claim 3, wherein said binder layer is an epoxy resin adhesive.

6. A resin-encapsulated semiconductor device according to claim 5, wherein said epoxy resin adhesive is a composition consisting of a bisphenol type epoxy resin, a phenol novolac type epoxy resin, imidazoles, butyl cellosolve and silver powder.

7. A resin-encapsulated semiconductor device according to claim 5, wherein said epoxy resin adhesive is a composition consisting of a bisphenol type epoxy resin, a phenol novolac type epoxy resin, imidazoles, N-methyl-2-pyrrolidone and silver powder.

8. A resin-encapsulated semiconductor device comprising:

a quadrangular-shaped semiconductor chip having a main surface and rear surface, wherein a plurality of external terminals are arranged at a peripheral area of said main surface;

a quadrangular-shaped chip supporting member for mounting said semiconductor chip on a chip mounting surface thereof, wherein said chip supporting member has a pair of first sides facing each other and a pair of second sides facing each other;

at least two first elongated through-holes arranged on a line parallel to one of said second sides, and at least two second elongated through-holes arranged on a line parallel to one of said first sides;

a binder layer which adheres said rear surface of said chip to said chip supporting member, wherein said binder layer is a epoxy resin adhesive;

a plurality of leads arranged adjacent to said external terminals, each of said leads having inner and outer lead portions, respectively;

a plurality of wires electrically connected between said external terminals and said inner lead portions, respectively; and a resin member for encapsulating said semiconductor chip, said chip supporting member, said inner lead portions and said wires, wherein said chip supporting member includes adhering portions surrounded by one of said first sides, one of said second sides, one of said first through-holes and one of said second through-holes, and wherein one of said adhering portions is joined with another of said adhering portions at a portion of said chip supporting member located between said first elongated through-holes.

9. A resin-encapsulated semiconductor device according to claim 5, wherein said epoxy resin adhesive is a composition consisting of a bisphenol type resin, a phenol novolac type epoxy resin, imidazoles, butyl cellosolve and silver powder.

10. A resin-encapsulated semiconductor device according to claim 5, wherein said epoxy resin is a composition consisting of a bisphenol type epoxy resin, a phenol novolac type epoxy resin, imidazoles, N-methyl-2-pyrrolidone and silver powder.

11. A semiconductor comprising:

A resin-encapsulated semiconductor device which comprises;

a quadrangular-shaped semiconductor chip having a main surface and a rear surface, wherein a plurality of external terminals are arranged at a peripheral area of said main surface;

a quadrangular-shaped chip supporting member for mounting said semiconductor chip on a chip mounting surface thereof, wherein said chip supporting member has a pair of first sides facing each other and a pair of second sides facing each other;

at least two first elongated through-holes arranged on a line parallel to one of said second sides, and at least two second elongated through-holes arranged on a line parallel to one of said first sides;

a binder layer which adheres said rear surface of said chip to said chip supporting member;

a plurality of leads arranged adjacent to said external terminals, each of said leads having inner and outer lead portions, respectively;

a plurality of wires electrically connected between said external terminals and said inner lead portions, respectively; and a resin member for encapsulating said semiconductor chip, said chip supporting member, said inner lead portions and said wires; and a circuit board for mounting said resin-encapsulated semiconductor device, wherein said chip supporting member includes adhering portions surrounded by one of said first sides, one of said second sides, one of said first through-holes and one of said second through-holes, and wherein one of said adhering portions is joined with another of said adhering portions at a portion of said chip supporting member located between said first elongated through-holes.

12. A semiconductor device according to claim 11, wherein said binder layer is a silicone rubber type binder.

13. A semiconductor device according to claim 11, wherein said binder layer is an epoxy resin adhesive.

14. A semiconductor device according to claim 13, wherein said epoxy resin adhesive is a composition consisting of a bisphenol type epoxy resin, a phenol novolac type epoxy resin, imidazoles, butyl cellosolve and silver powder.

15. A semiconductor device according to claim 13, wherein said epoxy resin adhesive is a composition consisting of a bisphenol type epoxy resin, a phenol novolac type epoxy resin, imidazoles, N-methyl-2-pyrrolidone and silver powder.

16. A lead frame according to claim 1, wherein said quadrangular-shaped chip supporting member is a rectangle.

17. A lead frame according to claim 1, wherein said quadrangular-shaped chip supporting member is a square.

18. A resin-encapsulated semiconductor device according to claim 3, wherein said quadrangular-shaped chip supporting member is a rectangle.

19. A resin-encapsulated semiconductor device according to claim 3, wherein said quadrangular-shaped chip supporting member is a square.

20. A resin-encapsulated semiconductor device according to claim 18, wherein said quadrangular-shaped chip supporting member is a rectangle.

21. A resin-encapsulated semiconductor device according to claim 18, wherein said quadrangular-shaped chip supporting member is a square.

22. A semiconductor device according to claim 11, wherein said quadrangular-shaped chip supporting member is a rectangle.

23. A semiconductor device according to claim 11, wherein said quadrangular-shaped chip supporting member is a square.

24. A lead frame according to claim 1, wherein said portion of said chip supporting member located between the first elongated through-holes is substantially in the center of said chip supporting member, and also forms an adhering portion.

25. A resin-encapsulated semiconductor device according to claim 18, wherein said portion of said chip supporting member located between the first elongated through-holes is substantially in the center of said chip supporting member, and also forms an adhering portion.

26. A resin-encapsulated semiconductor device according to claim 20, wherein said portion of said chip supporting member located between the first elongated through-holes is substantially in the center of said chip supporting member, and also forms an adhering portion.

27. A semiconductor device according to claim 22, wherein said portion of said chip supporting member located between the first elongated through-holes is substantially in the center of said chip supporting member, and also forms an adhering portion.

28. A lead frame for a semiconductor device comprising:

a quadrangular-shaped chip supporting member for mounting a semiconductor chip on a chip mounting surface thereof, wherein said chip supporting member has a pair of first sides facing each other and a pair of second sides facing each other;

at least two first elongated through-holes arranged on a line parallel to one of said second sides, and at least two second elongated through-holes arranged on line parallel to one of said first sides; and a plurality of leads arranged adjacent to said chip supporting member, wherein said chip supporting member includes adhering portions for adhering said semiconductor chip thereon, wherein each of said adhering portions is surrounded by at least one of said first or second sides, at least one of said first elongated through-holes and at least one of said second elongated through-holes, and wherein one of said adhering portions is joined to another of said adhering portions at a portion of said chip supporting member located between two of said first elongated through-holes.

* * * * *